United States Patent [19]

Shibasaki et al.

[11] 4,202,092
[45] May 13, 1980

[54] AUTOMATIC PART INSERTION MACHINE

[75] Inventors: Hatsuhiko Shibasaki; Junishi Omura, both of Ibaraki; Tetsuo Tanabe, Nagaokakyo; Kazumi Takamori, Takatsuki, all of Japan

[73] Assignee: Matsushita Electric Industrial Co., Ltd., Osaka, Japan

[21] Appl. No.: 6,202

[22] Filed: Jan. 24, 1979

Related U.S. Application Data

[63] Continuation-in-part of Ser. No. 833,569, Sep. 15, 1977, abandoned.

[30] Foreign Application Priority Data

| Sep. 17, 1976 | [JP] | Japan | 51-112354 |
| Sep. 17, 1976 | [JP] | Japan | 51-112355 |
| Sep. 17, 1976 | [JP] | Japan | 51-112356 |
| Sep. 17, 1976 | [JP] | Japan | 51-112357 |
| Sep. 17, 1976 | [JP] | Japan | 51-112358 |
| Sep. 17, 1976 | [JP] | Japan | 51-112359 |

[51] Int. Cl.$^2$ ..................... H05K 3/30; H05K 13/04
[52] U.S. Cl. ........................ 29/741; 29/759; 29/836; 29/838
[58] Field of Search ............ 29/741, 739, 759, 564.1, 29/626

[56] References Cited

U.S. PATENT DOCUMENTS

| 3,893,232 | 7/1975 | Fletcher et al. | 29/626 |
| 4,078,302 | 3/1978 | Fok et al. | 29/741 |

Primary Examiner—Carl E. Hall
Attorney, Agent, or Firm—Burgess, Ryan and Wayne

[57] ABSTRACT

A single automatic part insertion machine which can insert the leads of various electronic components such as resistors, IC chips, IF transformers, variable resistors, connectors and so on, into specified insertion or mounting holes of printed circuit boards. The boards are supported on a common set of conveyor rails in one row, and are displaced in X and Y coordinate directions while they are transferred from a feeding position to an unloading position. Specified lead insertion holes of specified printed circuit boards are thus aligned one at a time with selected units of a number of parts feeding means in a predetermined sequence, so that the leads of corresponding electronic components may be inserted into specified insertion holes of the printed circuit boards and clinched if required. An automatic unfinished printed circuit board loading device is provided, as well as an automatic finished printed circuit board stacking device.

10 Claims, 38 Drawing Figures

FIG. 2
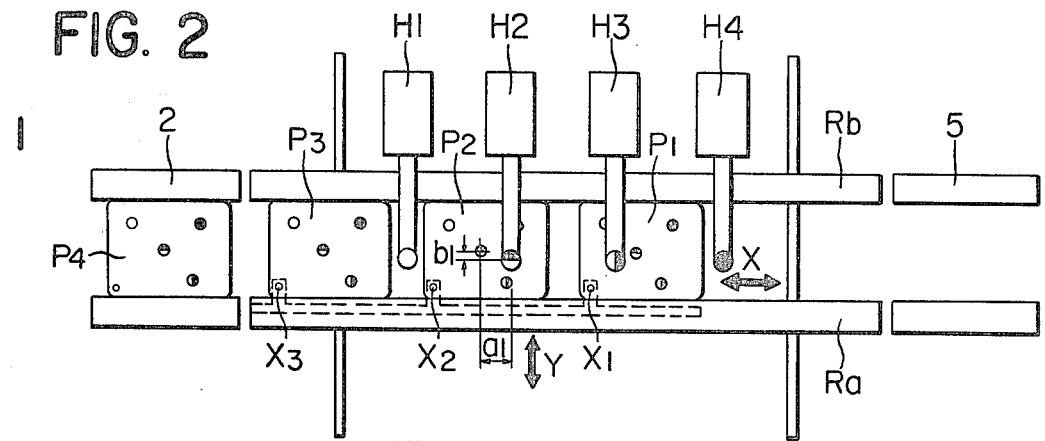
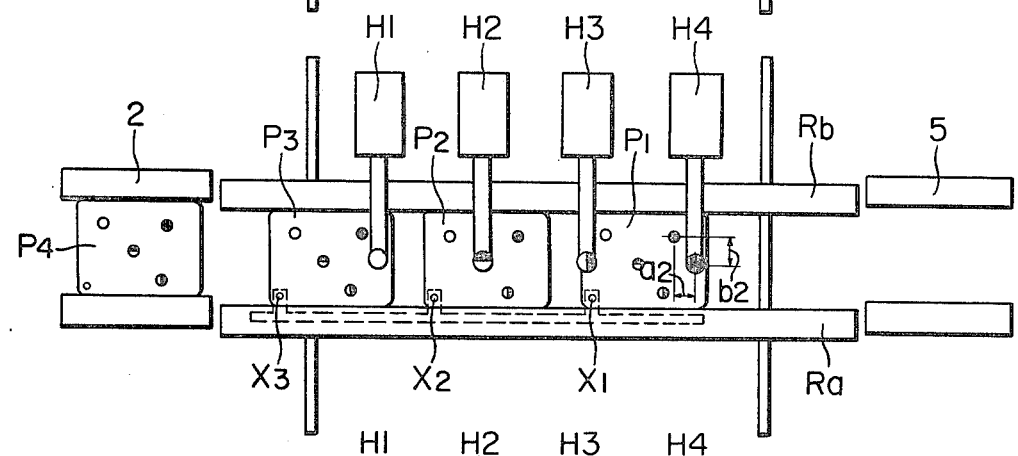
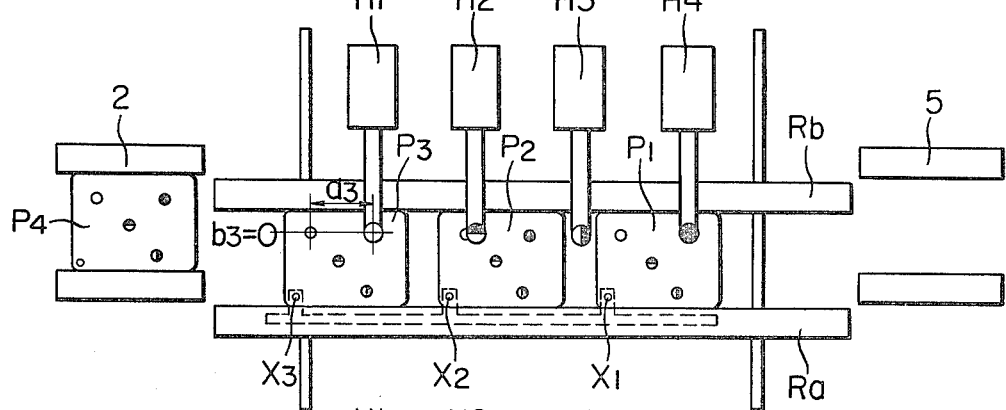
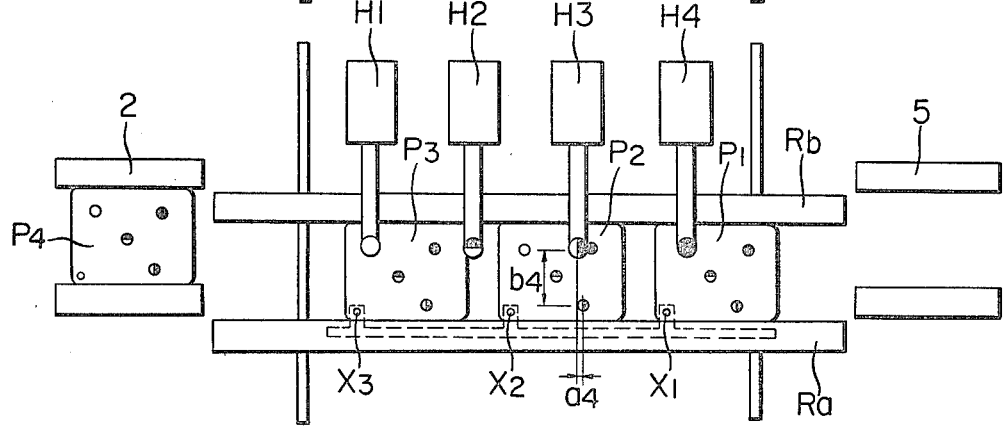

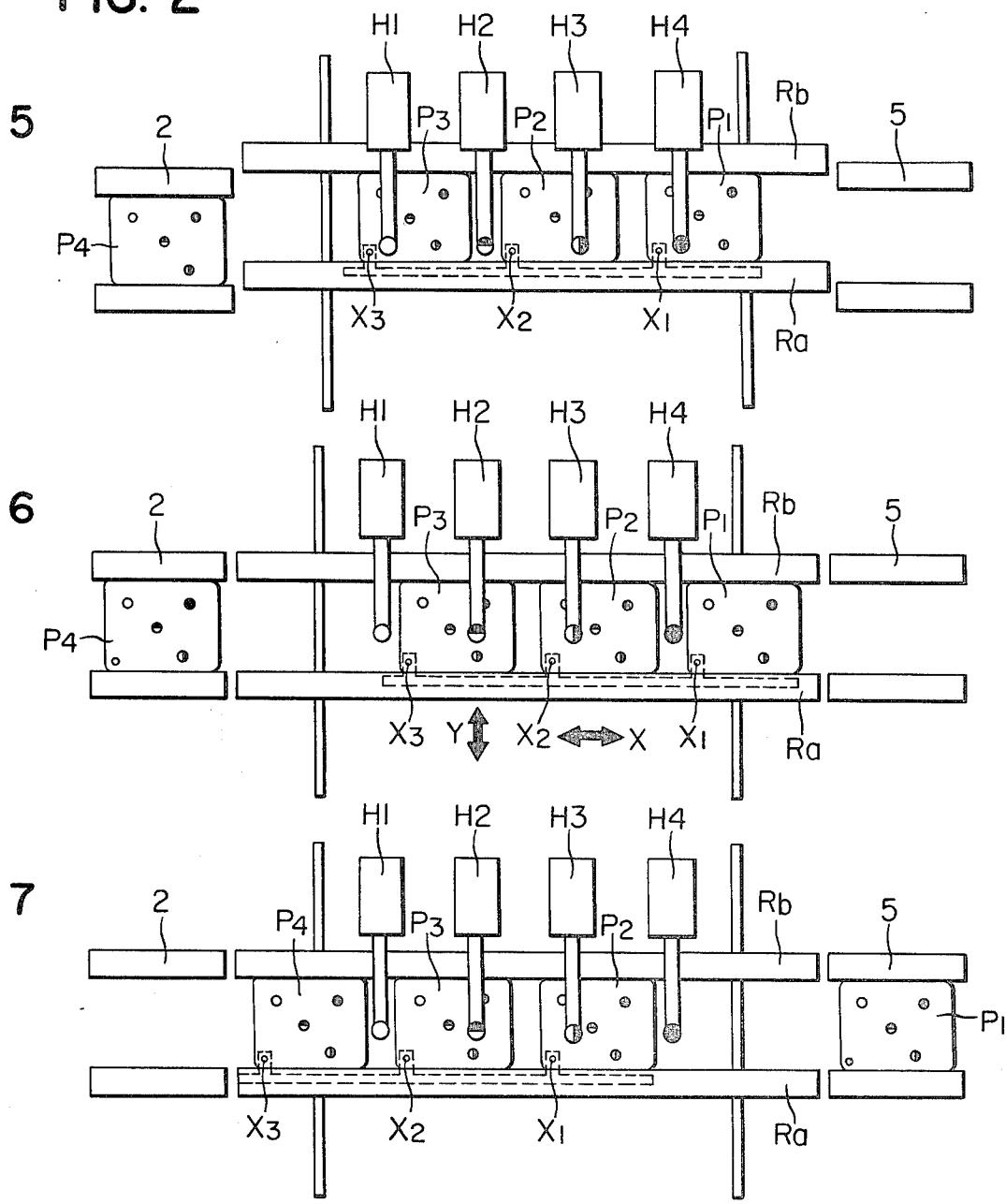

FIG. 11
(a) 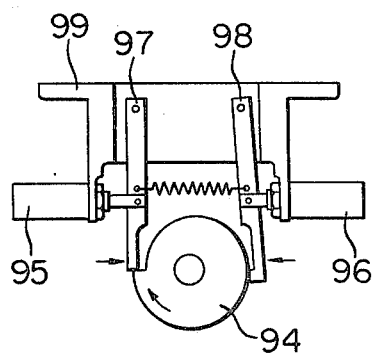
(b) 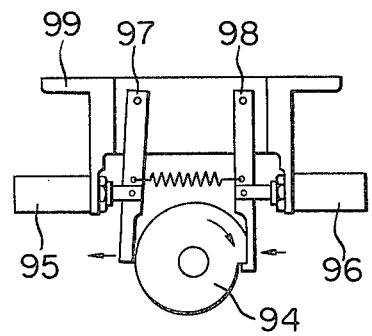
FIG. 12
(a) 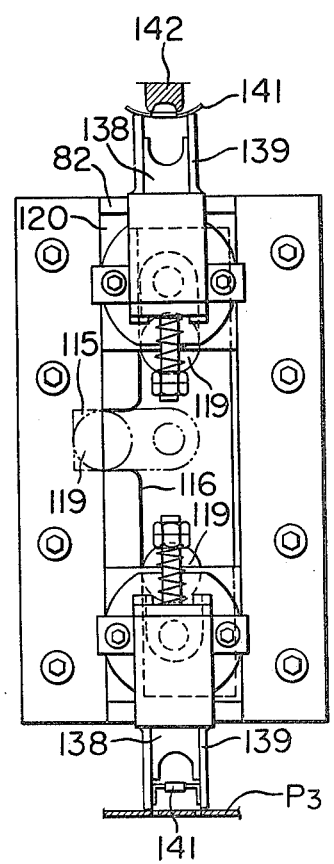
(b) 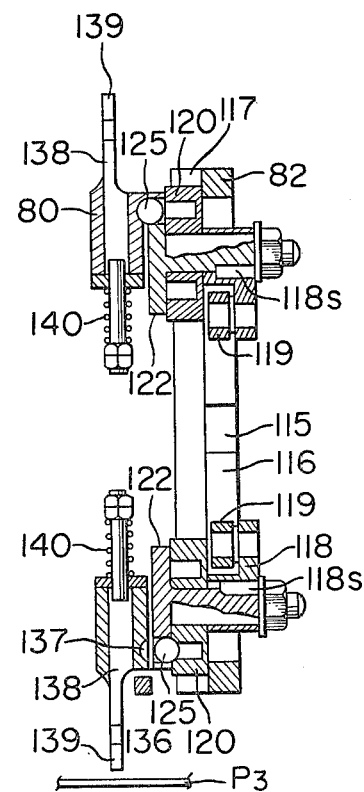

(a) (b)

(a) (b)

FIG. 17
FIG. 18
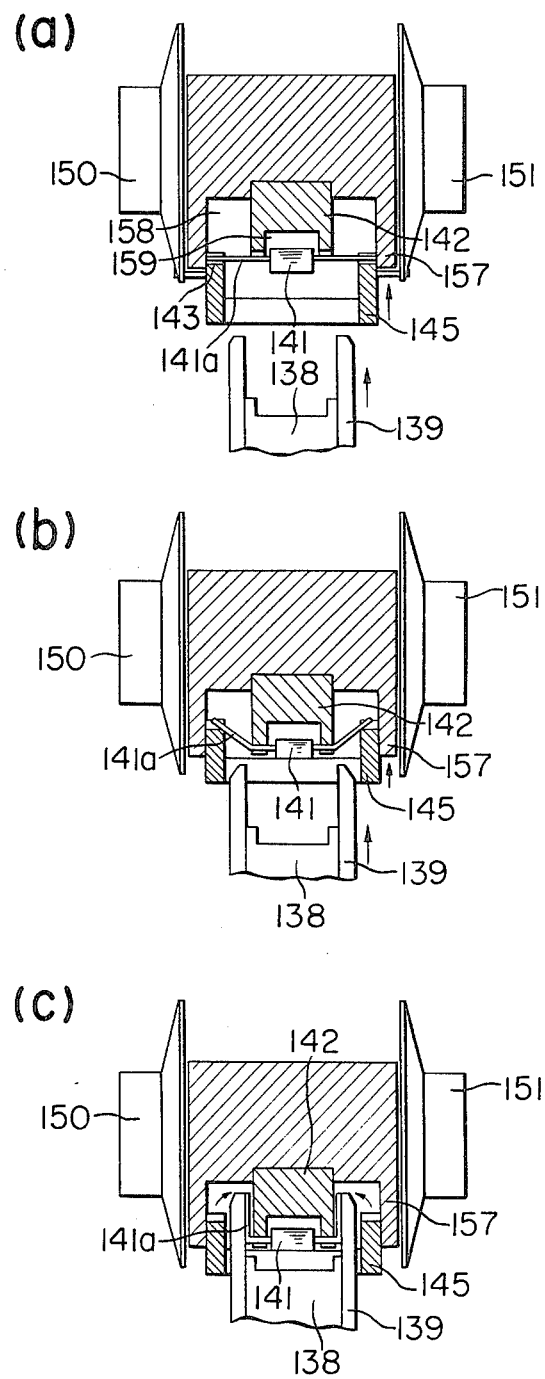
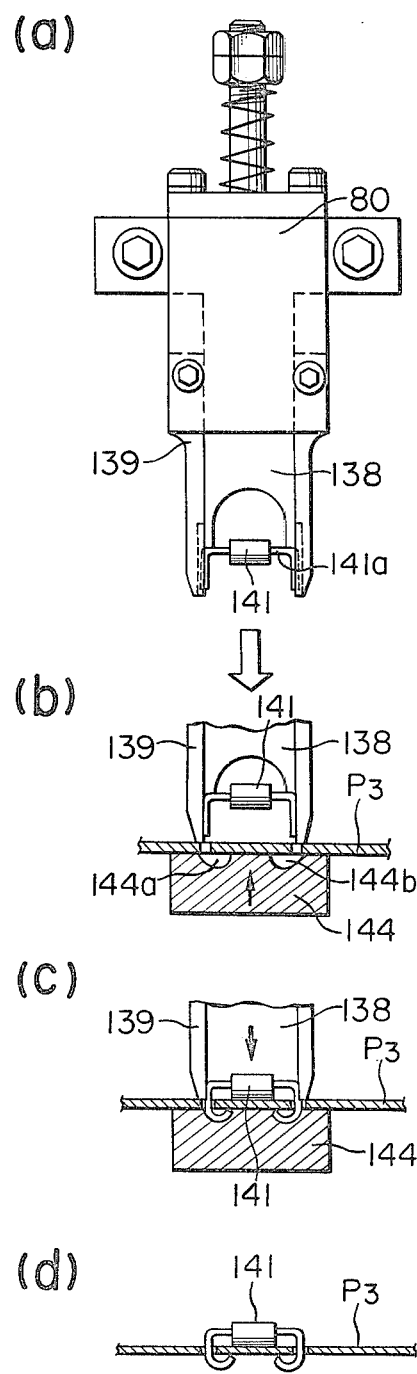

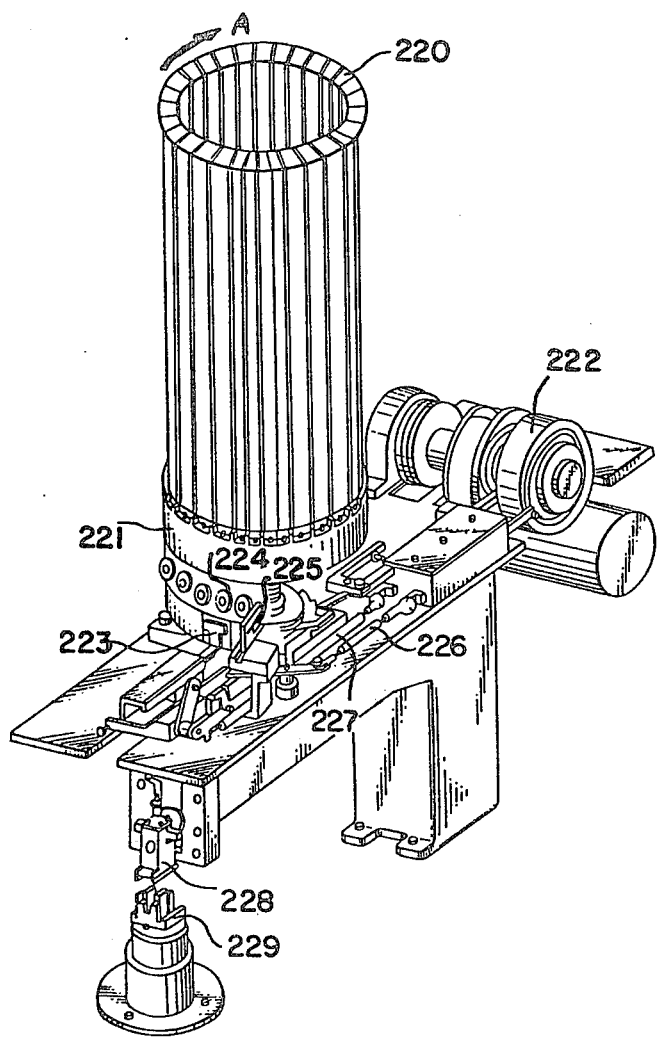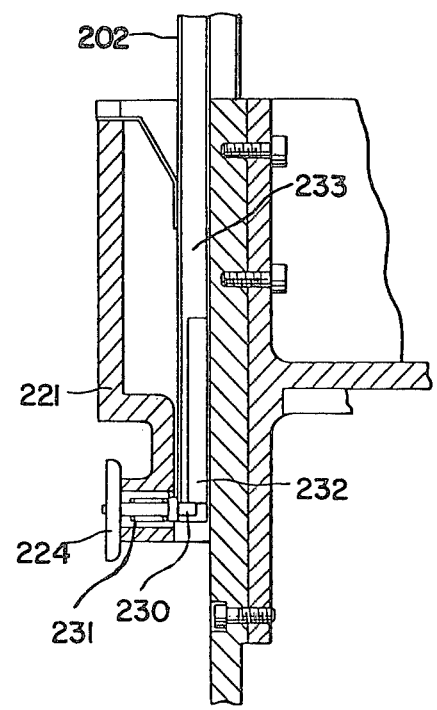

2

AUTOMATIC PART INSERTION MACHINE

This is a continuation-in-part of application Ser. No. 833,569, filed Sept. 15, 1977, now abandoned.

BACKGROUND OF THE INVENTION

The present invention relates to an automatic part insertion machine for automatically inserting the leads of various electronic and electric components or parts into specified insertion holes of printed circuit boards.

The various prior art automatic part insertion machines may be classified in general into two types. In one type, a table upon which is placed a printed circuit board is displaced in mutually perpendicular directions; that is, the X- and Y- directions by a numerical control system so that specified lead insertion holes of the printed circuit board may be brought to the part insertion position immediately below a part insertion head. The electronic and electric parts or components to be mounted on the printed circuit boards are stocked in the part insertion head according to a programmed sequence. Alternatively, they are fed to the part insertion head from the exterior thereof according to a programmed sequence. In either case, the electronic and electric parts or components which are mounted on the printed circuit boards by the part insertion head must be the same in size and shape. This type of machine is advantageous only where a relatively limited number of electronic and electrical parts or components are to be mounted on the printed circuit boards, but is disadvantageous from an economical standpoint when a relatively large number of electronic and electrical parts or components are to be mounted.

Furthermore, the automatic part insertion machines of the type described are not adapted to be arranged in one row so as to provide an effective, efficient and well coordinated printing circuit board production line, mainly because the time interval required for mounting a required number of electronic and electrical parts or components varies from one to another of the part insertion heads.

In the other type of part insertion machine, a plurality of part insertion heads are arranged in one array so that each of them may mount specified electronic or electrical parts or components on printed circuit boards as the latter are transferred from one to another of the part insertion heads or stations. This system is advantageous in mass production of printed circuit boards, but requires a longer production line and a large installation space. Also, readjustments of these machines to handle different electronic or electric parts or components are in general time-consuming and difficult.

SUMMARY OF THE INVENTION

One of the objects of the present invention is therefore to provide an automatic part insertion head arrangement which may mount on printed circuit boards various types of electronic and electrical parts such as resistors, IC chips, IF transformers, variable resistors, connector pins and so on, thereby improving the efficiency of the printed circuit board assembly.

Another object of the present invention is to provide an improved arrangement of automatic part insertion machines of the type described above which may be used individually or in combination in the automatic printed circuit board assembly line.

A further object of the present invention is to provide an automatic printed circuit board assembly line combining the automatic part insertion machines of the types described above with the pair of conveyor rails of the type described above as well as an automatic printed circuit board feeding device and an automatic finished printed circuit board stocking or stacking device, all of which may handle printed circuit boards different in size and printed circuit pattern, whereby the flexibility of the automatic printed circuit board assembly line may be substantially improved.

The present invention was made to make full use of the above and other merits or advantages of the prior art automatic part insertion machines and to overcome or eliminate the above and other disadvantages thereof. An important feature of the present invention is a pair of spaced parallel rails which support a plurality of printed circuit boards in one row in the lengthwise direction and which permit the printed circuit boards to be displaced in mutually perpendicular directions; that is, the X- and Y-directions in rectangular coordinates while the printed circuit boards are being transferred from their loading or feeding to unloading positions, so that predetermined lead insertion holes of specified printed circuit boards may be brought, two or more at a time, to the part insertion position of a specified part insertion head and corresponding electronic and electrical parts or components may be mounted on the printed circuit boards in a predetermined sequence. The part insertion heads in accordance with the present invention may preferably be of the built-in type and may be arranged in an array along one side of the pair of conveyor rails. In addition, an aspect of the present invention provides an automatic printed circuit board loading or feeding device as well as an automatic finished printed circuit board stocking or stacking device so that the degree of the automation may be substantially improved as compared with the prior art machines. When the part insertion heads in accordance with the present invention are arranged in one row, a fully automatic printed circuit board assembly line may be provided which is very efficient in production.

In this specification, the term "to mount" a part on a printed circuit board is interchangeably used with the term "to insert" the leads of the part into the specified lead insertion holes of the printed circuit board.

BRIEF DESCRIPTION OF THE ACCOMPANYING DRAWINGS

FIG. 2 is a view used for the explanation of the movement in the mutually perpendicular directions of printed circuit boards on a pair of conveyor rails so that lead insertion holes of the printed circuit boards may be brought, one at a time for the sake of simplicity in explanation, to the part feeding position of a specified part insertion head according to a programmed sequence;

FIG. 11 is a view used for the explanation of the mode of operation of a one-way clutch which is mounted on a driving shaft of the driving power transmission system shown in FIG. 10 so as to transmit the driving power to each of the part insertion heads;

FIG. 12 is a view used for the explanation of the principle of a mechanism so constructed and arranged as to cause a part insertion chuck to rotate through 180° at the midpoint of the ends of the upper or lower stroke;

FIG. 17 is a view used for the steps for forming the leads of the separated axial type part and causing the formed leads to be gripped by the insertion chuck;

FIG. 18 shows the steps for inserting the leads of the axial type part gripped by the part insertion chuck into the specified lead insertion holes of a printed circuit board and for clinching the lead portions extended through the insertion holes against the circuit pattern side or the undersurface of the printed circuit board;

Figure 19:
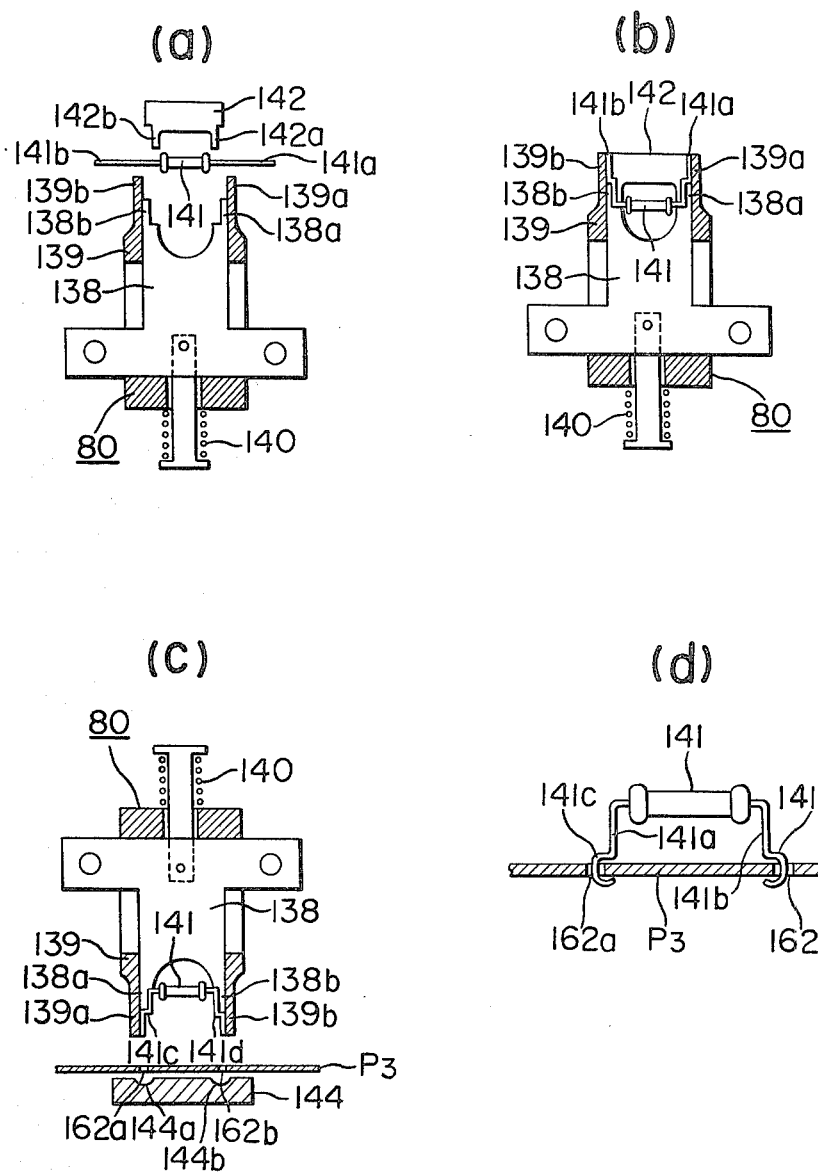
Figure 20:
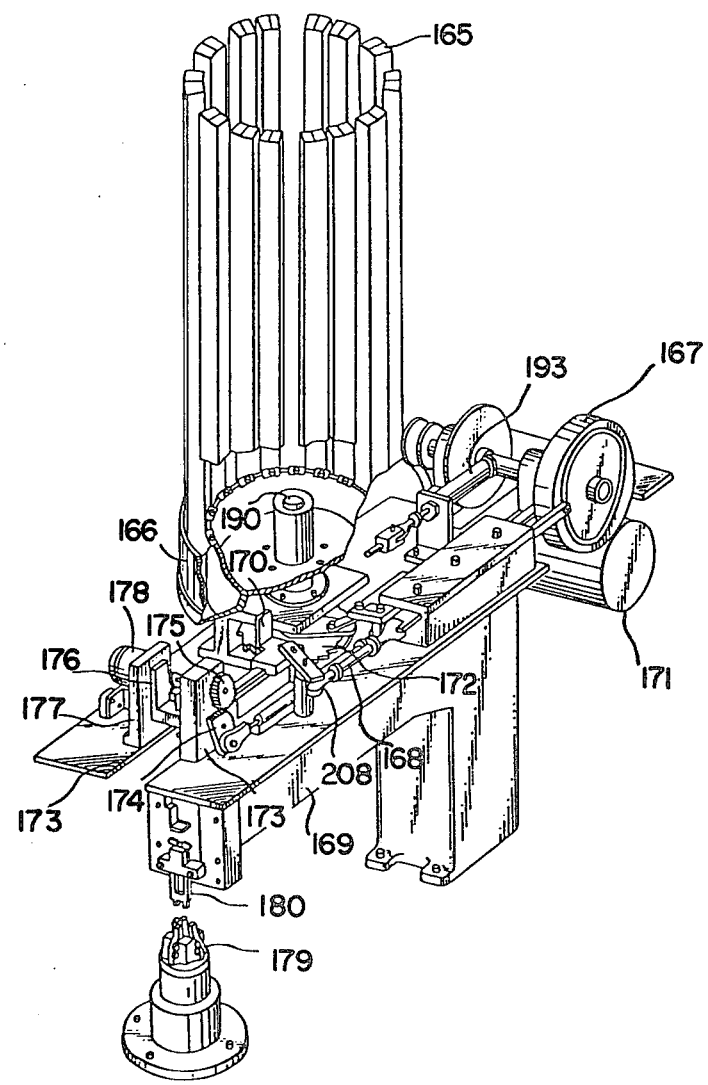
Figure 21:
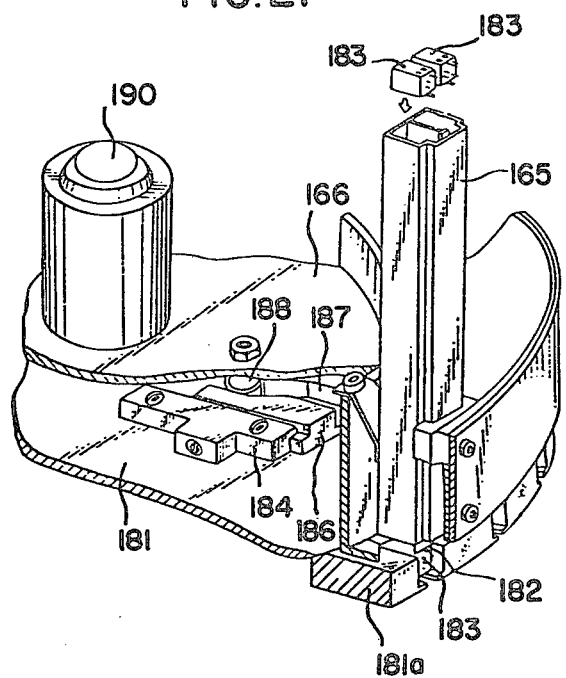
Figure 25:
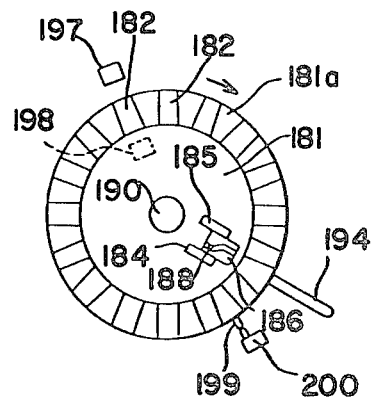
Figure 27:
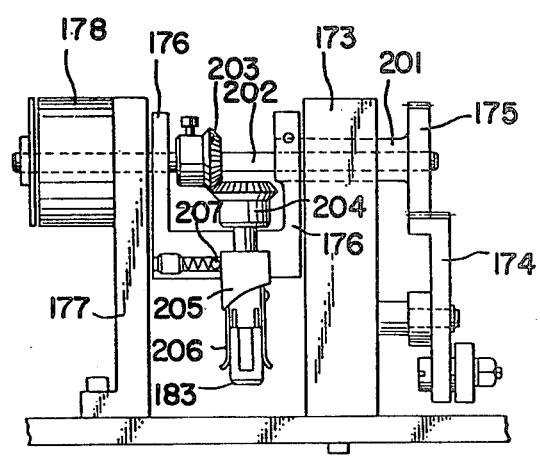
Figure 28:
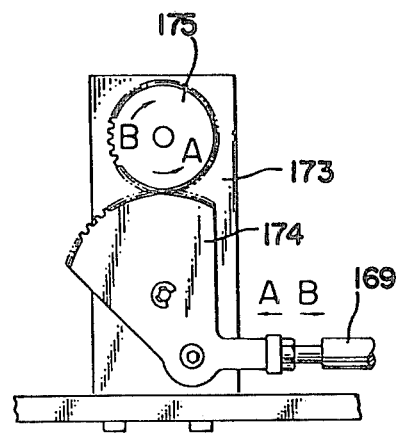
Figure 26:
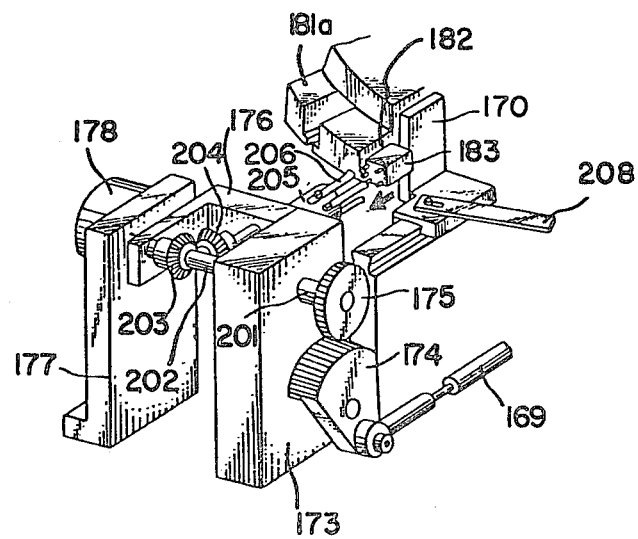
Figure 29:
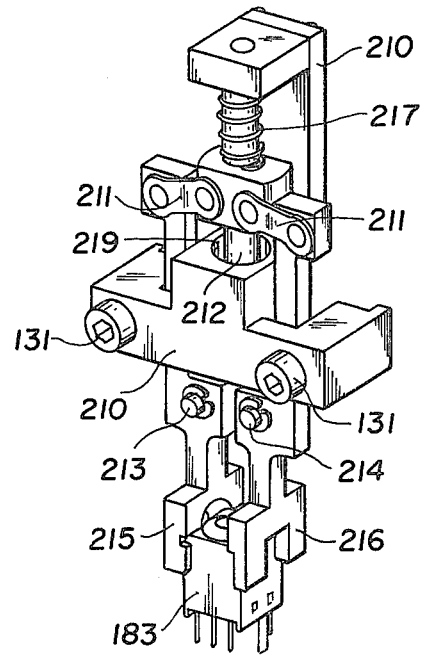
Figure 30:
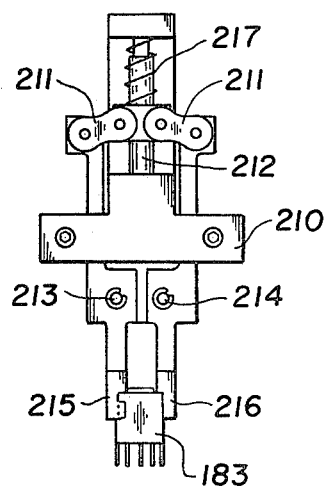
Figure 31:
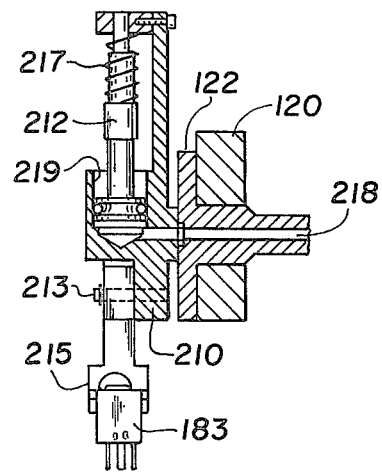
Figure 34:
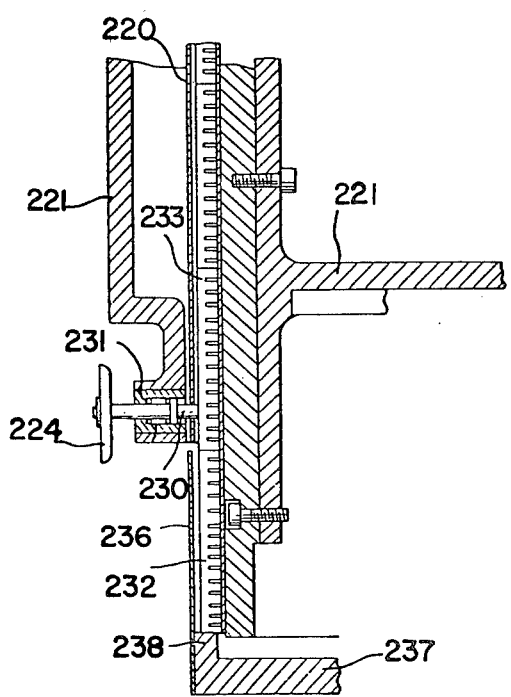
Figure 37:
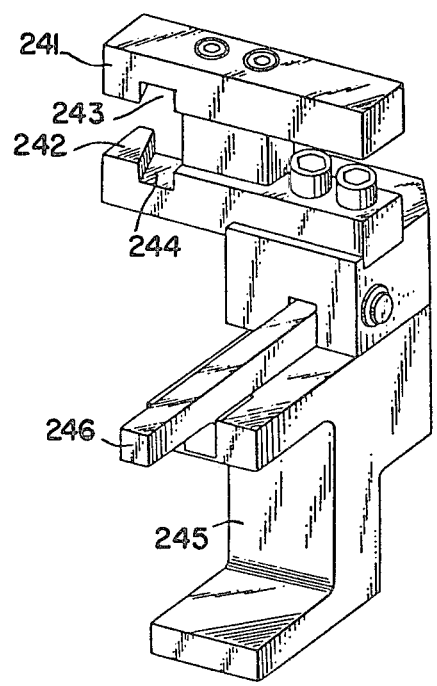
Figure 38:
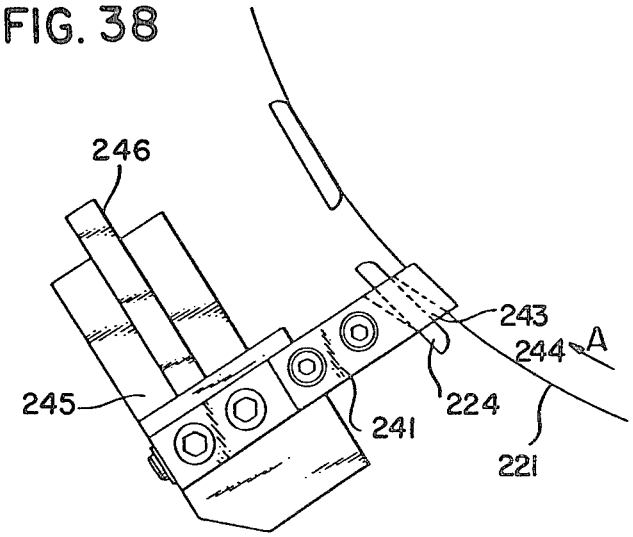
Figure 35:
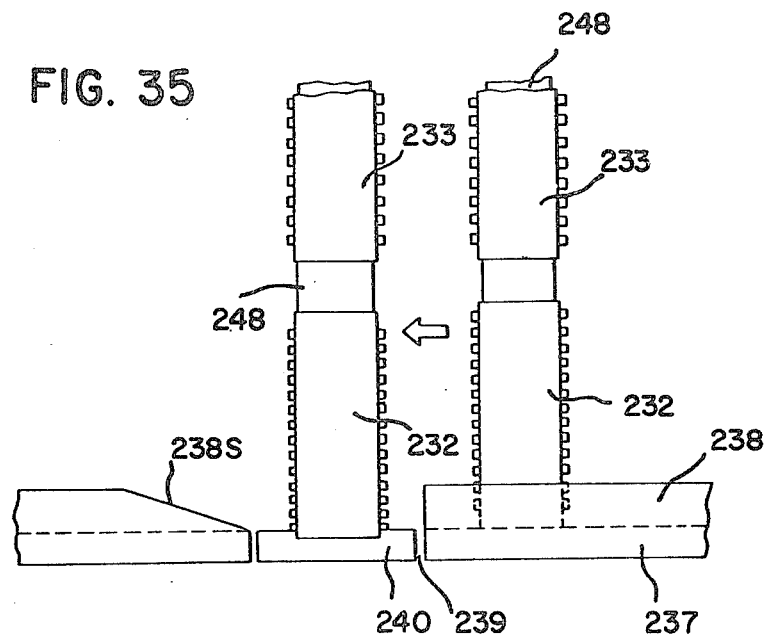
Figure 36:
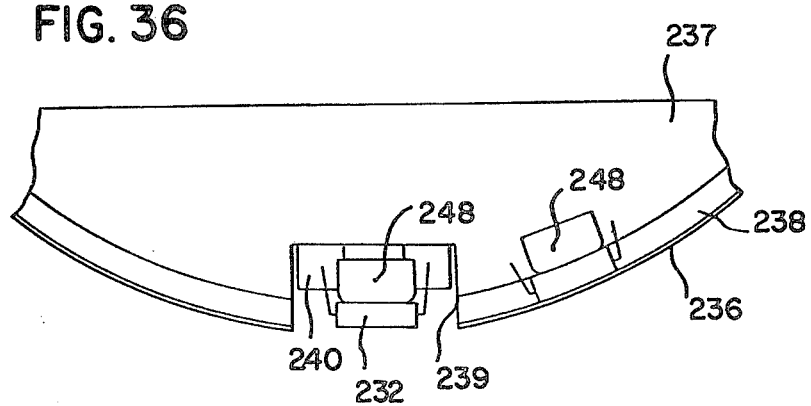

FIG. 19 shows the steps for forming the leads of the separated axial type part in such a way that when they are inserted into the specified insertion holes of a printed circuit board, the main body of the axial type part may be floated upwardly of the upper surface or the component side of the printed circuit board and for clinching the lead portions extended out of said specified insertion holes against the circuit pattern side or the undersurface of the printed circuit board with the aid of an anvil;

FIG. 20 is a perspective view of a part insertion head so constructed and arranged as to feed, one at a time, an electronic or electrical part such as an intermediate frequency transformer (IFT) of the type having the leads extended from one end or the bottom thereof and for mounting this part on a printed circuit board;

FIGS. 21, 22, 23 and 24 are views used for the explanation of a mechanism for switching the alignment of one part loading chamber in a part loading magazine with a part feeding position to the alignment of another part loading chamber of the magazine with the part feeding position when said one part loading chamber is emptied;

FIG. 25 is a view used for the explanation of an optical system for detecting whether or not said one part loading chamber of the magazine is emptied and an electrical system for detecting the angular position of a drum upon which are mounted the magazines;

FIGS. 26, 27 and 28 are views used for the construction and mode of operation of a mechanism for bringing to the vertical position of an IFT which has been delivered to the feed position in the horizontal position;

FIGS. 29, 30 and 31 are views used for the explanation of the construction as well as the mode of operation of a part insertion chuck adapted to grip and mount an IFT on a printed circuit board;

FIG. 32 is a perspective view of an IC chip insertion head;

FIG. 33 is a fragmentary vertical sectional view, in an enlarged size, thereof, illustrating the mounting of a magazine containing IC chips or elements therein and how a magazine holder is preventing the lowermost IC chip or element in the magazine from dropping out of it;

FIG. 34 is a view similar to FIG. 33 but illustrating a magazine holder at the feed or index position;

FIGS. 35 and 36 are views used for the explanation of the steps for bringing the IC chips or elements stacked lengthwise in the magazine to the feeding or index position;

FIGS. 37 and 38 are views used for the explanation of the construction as well as the mode of operation of a mechanism which releases the magazine holder, thereby dropping the lowermost IC chip or element in the magazine onto an annular guide which in turn brings said dropped IC chip or element to said feed or index position.

DESCRIPTION OF THE PREFERRED EMBODIMENT

Figure 1:
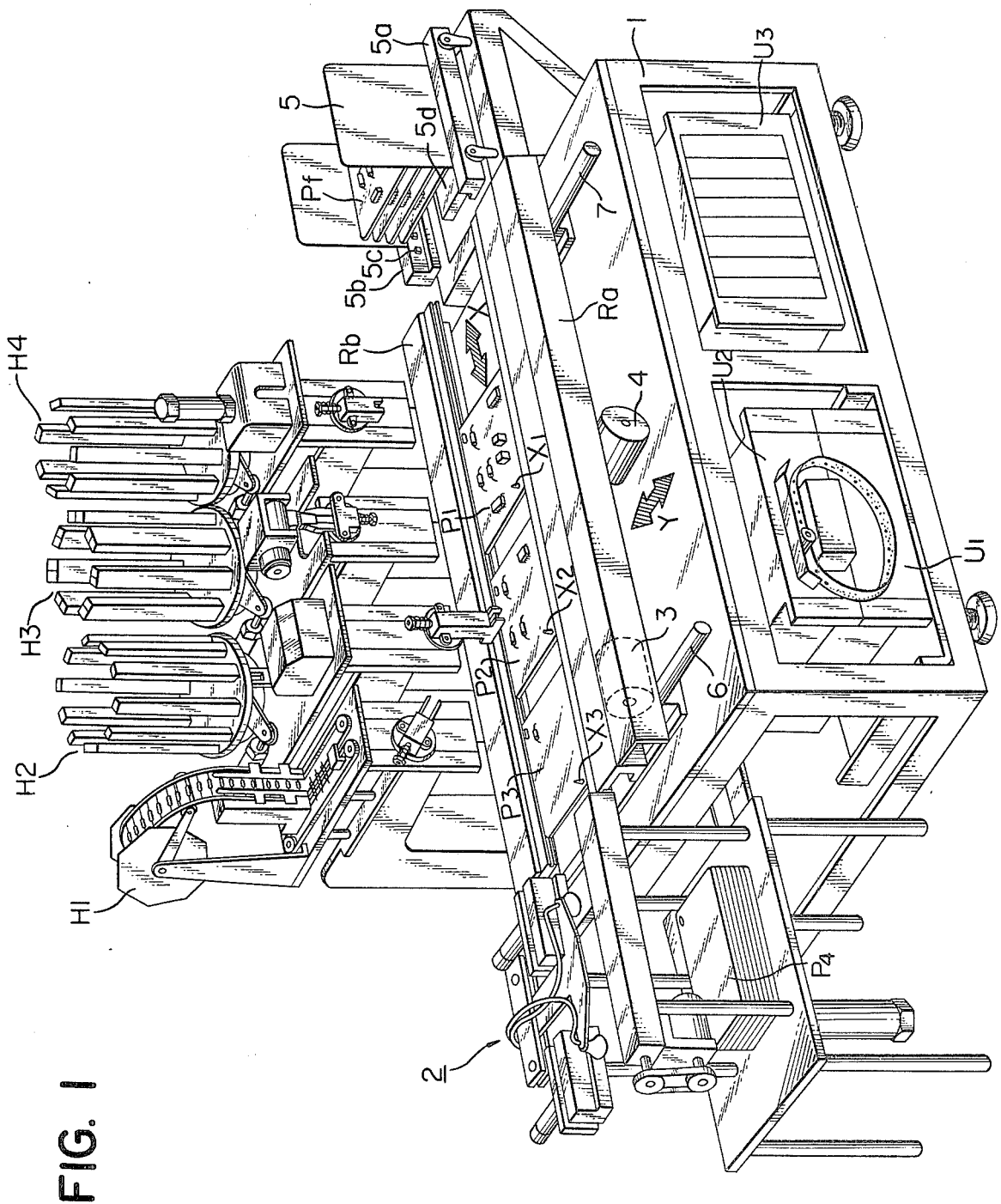
FIG. 1 is a perspective view of an automatic part insertion machine in accordance with the present invention, illustrating a standard arrangement of various devices to be described below.

Referring to FIG. 1, reference numeral 1 denotes a box-shaped bed upon which are mounted an NC motor driver U1, a taper reader U2, a sequence controller U3 and other control equipment. A printed circuit board loading or feeding device 2 is located at one end (left end) of the bed 1 and brought into contact therewith. As will be described in detail hereinafter with particular reference to FIG. 46, a plurality of printed circuit boards P4, P5 . . . stacked on the feeding device 2 are fed one by one into the assembly line. As is well known in the art, the printed circuit boards P have circuit patterns of conductors and are formed with holes into which are inserted the leads of components to be mounted on the printed circuit boards P.

A printed circuit board stocking or stacking device 5 is located at the other (right) end of the bed 1 so as to receive and stack the printed circuit boards Pf upon which have been mounted the required electrical and electronic components (to be referred to as "the assembled or finished printed circuit boards" in this specification). The stocking or stacking device 5 comprises a pair of parallel guide rails 5a and 5b extended in the longitudinal direction of the bed 1. A plurality of pawls 5c each having a pyramid shaped head are inserted into holes formed into the inner side surfaces of each guide rail 5a or 5b and spaced apart from each other by a suitable distance. Each of the pawls 5c is biased by a spring in such a manner that the finished printed circuit board Pf may be permitted to move only upwards between the pair of guide rails 5a and 5b. That is, when the finished printed circuit board is unloaded into the stocking or stacking device 5 between the pair of guide rails 5a and 5b, it is pushed upwards by means of an elevator plate 5d, which is driven by an air cylinder (not shown), whereby the finished printed circuit board Pf may be supported by the pawls 5c.

A pair of conveyor rails Ra and Rb are mounted on the top of the bed 1 for supporting a plurality of (three in this embodiment) printed circuit boards P1, P2 and P3 in one row. More particularly, the conveyor rails Ra and Rb are so mounted that they may reciprocate in the directions indicated by the double-pointed arrow Y along guide rods 6 and 7 which in turn are mounted on the top of the bed 1 transversely thereof and in parallel with each other. The conveyor guide rails Ra and Rb are driven by a pulse motor 4.

Three printed circuit boards P1, P2 and P3 which are held by the conveyor rails Ra and Rb may be simultaneously moved therealong in the directions indicated by the double-pointed arrow X. The movement in the X-directions of the printed circuit boards P1, P2 and P3 is caused by the movement of hooks X1, X2 and X3 which are equidistantly spaced apart from each other and are brought into engagement with reference holes of the printed circuit boards P1, P2 and P3. The movement of these hooks X1, X2 and X3 in turn is caused by a pulse motor 3. The construction and mode of operation of the conveyor rails Ra and Rb will be described in more detail hereinafter with particular reference to FIG. 3.

Electronic part insertion heads H1,H2,H3 and H4 are disposed above the conveyor rails Ra and Rb and spaced apart from each other in a longitudinal direction by a suitable distance so that different parts may be fed and mounted on the printed circuit boards P1, P2 and P3 on the conveyor rails Ra and Rb as will be described in detail hereinafter. It is to be noted that the distance between the part insertion heads H1–H4 is not needed to be equal to the distance or pitch between the printed circuit boards P1, P2 and P3.

Next referring to FIG. 2, the correspondence between the printed circuit boards P1, P2 and P3 on the one hand and the part insertion heads H1–H4 and the method for inserting the leads of electronic components or parts into predetermined insertion holes of the printed circuit boards P1, P2 and P3 will be described.

Referring first to FIG. 2-1, the printed circuit boards P1, P2 and P3 are shown as being located at the "origin" or their initial positions. That is, the left ends of the conveyor rails Ra and Rb are in line with the feeding or loading device 2 which is ready to feed or load the next printed circuit board P4 into the conveyor rails Ra and Rb. As described above, the printed circuit boards P1, P2 and P3 on the conveyor rails Ra and Rb are engaged with the positioning hooks X1, X2 and X3, respectively, and are spaced apart from each other by a prdetermined distance. As the positioning hooks X1, X2 and X3 are driven in the X-directions by the pulse motor 3, the printed circuit boards P1, P2 and P3 are also moved in the same direction. Furthermore, as the conveyor rails Ra and Rb are moved in the Y-direction by the motor 4, the printed circuit boards P1, P2 and P3 on them are moved in the same direction in unison. The printed circuit boards P are formed with the insertion holes into which are inserted the leads of various electronic parts or components. For the sake of explanation, the insertion holes into which are inserted the leads of the electronic parts or components by the insertion heads H1–H4, respectively, are indicated by the symbols ○, ⊖, ⓘ and 04, respectively.

The first insertion is made by one of the insertion heads H1–H4 which is most closely located with respect to the corresponding insertion hole of the printed circuit boards P1, P2 or P3. For instance, as shown in FIG. 2-1, the distance between the insertion hole ⊖ and the insertion head H2 which is destined to insert the leg of an electronic part or component into this insertion hole as compared with the distances between the other insertion holes and heads. Therefore, all the circuit boards P1, P2 and P3 are displaced in unison by a distance a in the X-direction and a distance b-1 in the Y-direction so that the insertion head H2 is aligned with the insertion hole ⊖ and the lead of an electronic component or part is inserted into this hole by the insertion head H2 as indicated in FIG. 2-2.

In the next step, the printed circuit boards P1, P2 and P3 are regarded as being located at the "origin" and the insertion hole whose distance to the corresponding insertion head H is shortest is sought. In FIG. 2-2, the distance between the insertion hole ⊖ of the printed circuit board P3 and the insertion head H4 is shortest. Then, the printed circuit boards P1, P2 and P3 are all displaced by a distance $a_2$ in the X-direction and a distance $b_2$ in the Y-direction so that the insertion hole may be aligned with the insertion head H4. In like manner, the succeeding insertion holes are sought and the leads of elecronic parts or components are inserted into them as shown in FIGS. 2-3, 2-4 and 2-5.

After the last insertion step shown in FIG. 2-5, the printed circuit boards P1, P2 and P3 are displaced to the positions shown in FIG. 2-6, where they are at the "origin" in the Y-direction shown in FIG. 2-1, but in the X-direction, they are displaced by the distance equal to the distance between the adjacent positioning hooks. That is, the positioning hook X3 is displaced to the position at which the hook X2 was located in FIG. 2-1. In like manner, the hook X2 is displaced to the position where the hook X1 in FIG. 2-1 was located. Under these conditions, the printed circuit board P1 has been finished or assembled and passed past the insertion head H4 in the right direction. That is, all the required electronic parts or components have been mounted on the printed circuit board P1 through its insertion holes so that the board P1 is now the finished or assembled board Pf.

Figure 6:
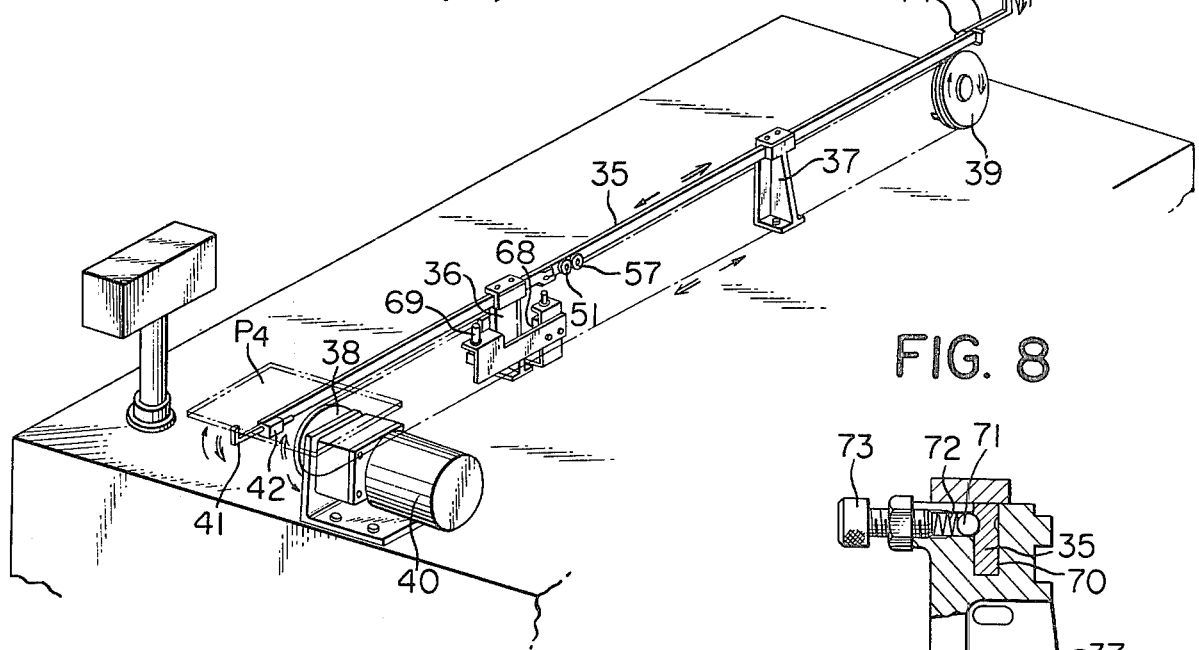
FIGS. 6, 7 and 8 are views used for the explanation of the fundamental construction of the LU system.
Figure 7:
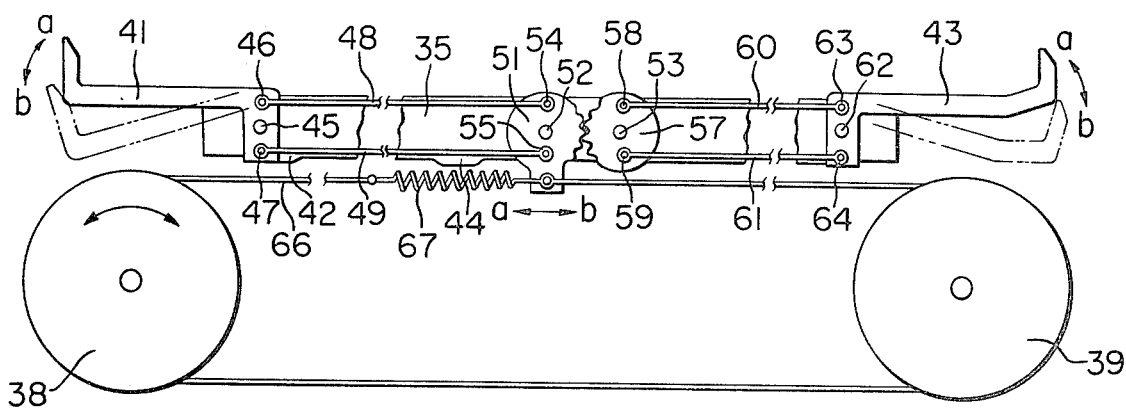

In the positions shown in FIG. 2-6, the positioning hooks X-1, X-2 and X-3 are disengaged from their corresponding reference holes of the printed circuit boards P1, P2 and P3 and are returned to their initial positions shown in FIG. 2-1 after moving below the lower or circuit pattern sides of the boards P1, P2 and P3. During the return stroke of the positioning hooks X1, X2 and X3 in the manner described above, the LU system, which will be described in detail hereinafter, loads or feeds the new printed board P4 on the conveyor rails Ra and Rb at their left ends while the finished or assembled printed board P1 is unloaded into the stocking or stacking device 5. Thereafter, the positioning hooks X1, X2 and X3 which have returned to their initial positions engage with the reference holes, respctively, of the printed circuit boards P2, P3 and P4, as shown in FIG. 7, whereby the cycle for displacing them in the manner described hereinabove, may be started again.

Figure 3:
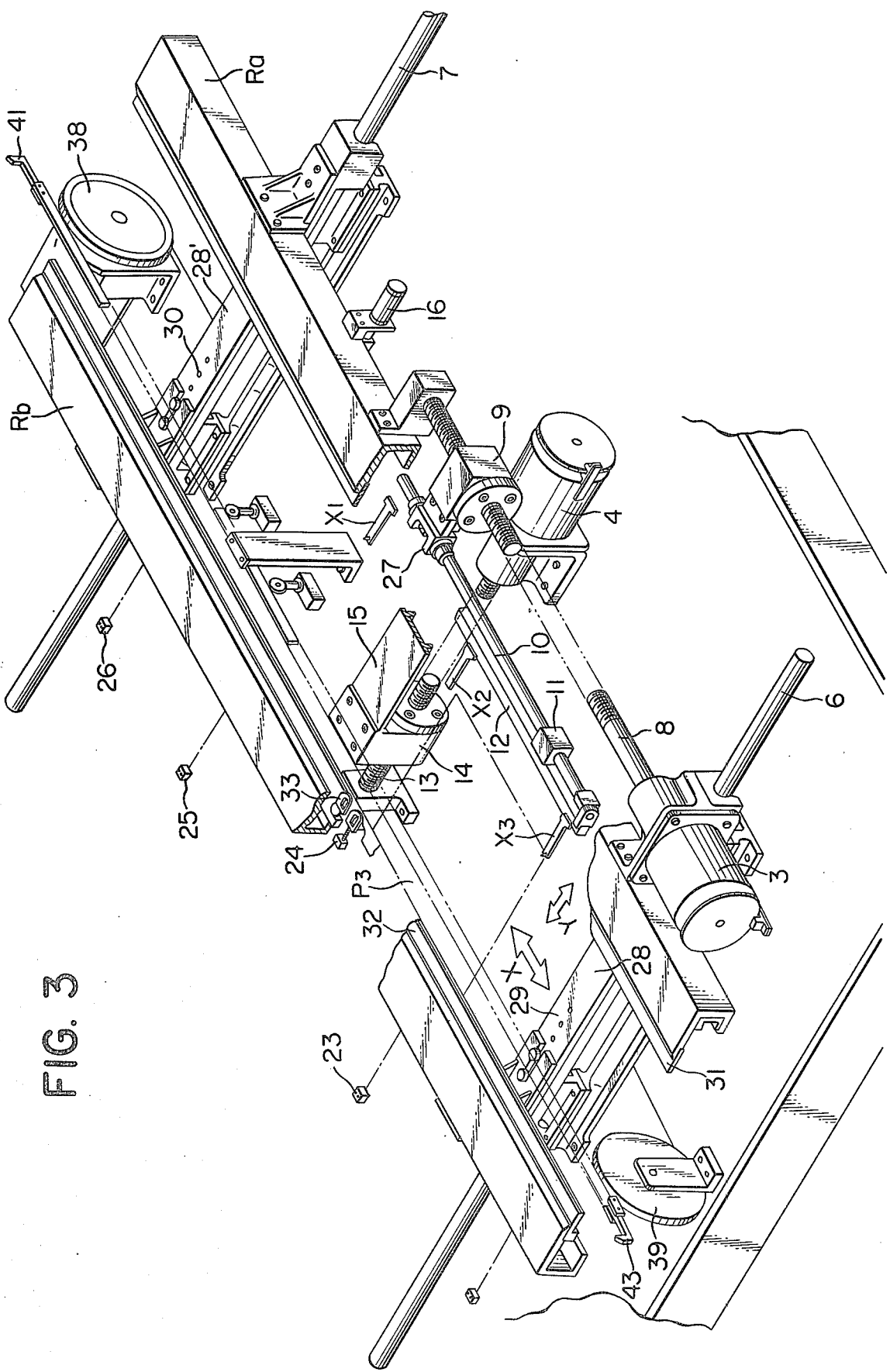
FIG. 3 is a view used for the explanation of the mode of operation of the pair of conveyor rails upon which are supported, positioned and transferred the printed circuit boards.

FIG. 3 shows the detailed construction of the conveyor rails Ra and Rb which permit displacement of the printed circuit board in both the X- and Y-directions in the manner described above so that the leads of the required electronic components or parts may be sequentially inserted into the specified insertion holes of the printed circuit boards P.

Guide plates 31 and 32 with printed circuit board guide grooves are rigidly attached to the conveyor rails Ra and Rb in opposed relationship. The guide plates 31 are provided with a plurality of pushers 33 each biased with a compression spring (not shown) so that when the printed circuit board P is guided by the guide plates 31 and 32, these pushers 33 press the printed circuit board P against the bottom of the guide groove of the guide plate 32, thereby preventing a zig-zag movement of the printed circuit board P.

The conveyor rails, which are interchangeably referred to as "the rail main bodies Ra and Rb" hereinafter in this specification, are mounted on sliding blocks 28 and 28' which in turn are slidably mounted on the transverse or Y-direction guide rods 6 and 7 on the bed 1. A plurality of tapped holes 29 and 30 are formed in the upper surface of each of the sliding blocks 28 and 28' where the conveyor rails Rb is mounted and these tapped holes 29 and 30 are spaced apart from each other by a suitable distance. Therefore, it is apparent that the distance between the conveyor rails Ra and Rb may be adjusted depending upon the size of the printed circuit board P to be used.

The driving shaft of the Y-direction pulse motor 4 is connected to a lead screw 13 which is supported by suitable bearings on the bed 1 intermediate the transverse guide rods 6 and 7. One end of a bracket 15 is rigidly attached to a nut 14 screwed over the lead screw 13 while the other end is extended horizontally and rigidly attached to the undersurface of the conveyor rail Ra with bolts or the like. Thus, it is apparent to those skilled in the art that upon rotation of the Y-direction pulse motor 4, the conveyor rails Ra and Rb are caused to move in the Y-direction. The displacement of the conveyor rails Ra and Rb is of course dependent upon the angular displacement of the driving shaft of the Y-direction pulse motor 4.

The mechanism for driving the printed circuit boards P on the conveyor rails Ra and Rb in the X-direction is mounted on the conveyor rail Ra. The driving shaft of the X-direction pulse motor 3 is connected to a lead screw 8 on which a threaded nut 9 is mounted in a non-rotatable manner. A pair of longitudinally spaced apart bearing blocks 11 which are mounted within the conveyor rail Ra support a feed shaft 10 in such a manner that the feed shaft 10 may not only rotate about its axis but also slide in a longitudinal direction. A hook supporting lever 12 upon which are attached the hooks X1, X2 and X3 is carried by the feed shaft 10 in parallel therewith. The non-rotatable threaded nut 9 on the lead screw 8 is connected to the feed shaft 10 through a joint 27 which is so attached to the feed shaft 10 that the rotation of the shaft 10 about its axis may be permitted but the movement in the longitudinal direction with respect to the joint 27 may not be permitted. This joint 27 is extended through an elongated slot (not shown) formed through the side wall of the conveyor rail Ra. Thus, as the lead screw 8 is rotated by the X-direction pulse motor 3, the threaded nut 9 translates along the lead screw 8, whereby the feed shaft 10 and hence the hooks X1, X2 and X3, may be moved in the X-direction.

Figure 4:
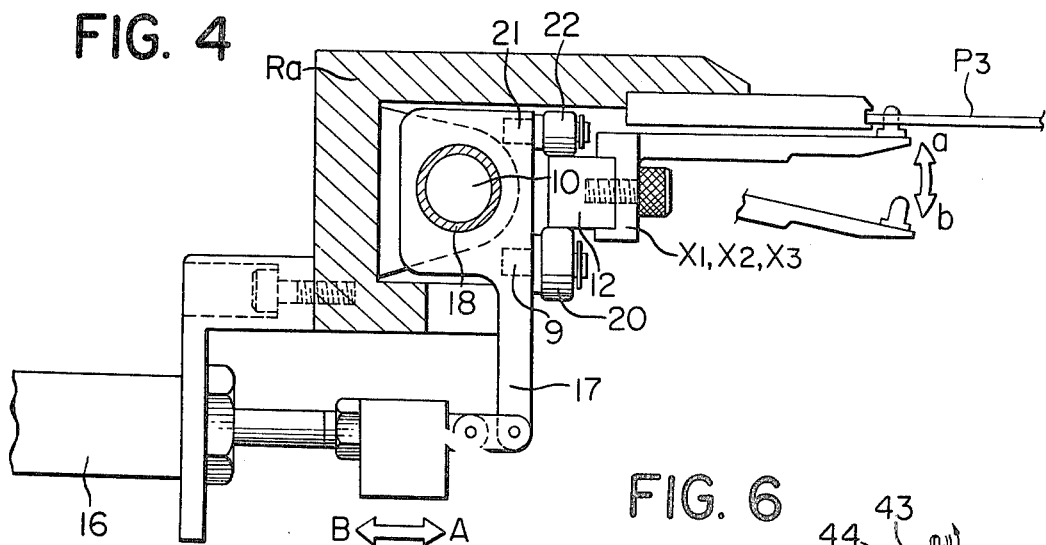
FIG. 4 is a view used for the explanation of the mode of operation of hooks X1, X2 and X3 of the pair of conveyor rails Ra and Rb for engagement with or disengagement from the reference holes of the printed circuit boards.

Referring to FIG. 4, the feed shaft 10 is slidably fitted through a bearing metal 18 through a lever 17 on which are mounted rollers 20 and 22 with pins 19 and 21. These rollers 20 and 22 ride over the hook supporting lever 12. The lower end of the lever 17 is connected to the piston rod of an air cylinder 16. Therefore, when the piston rod of the air cylinder 16 is extended in the direction A, the lever 17 is caused to rotate about the feed shaft 10 in the counterclockwise direction so that the hook supporting lever 12 is also caused to rotate in the same direction and consequently the hooks X1, X2 and X3 are swung in the direction indicated by the arrow a, thereby engaging the reference holes of the printed circuit boards P on the conveyor rails Ra and Rb. When the piston rod of the air cylinder 16 is retracted in the direction B, the operation is reversed so that the hooks X1, X2 and X3 are swung in the direction indicated by the arrow b, disengaging from the reference holes of the printed circuit boards P. It is to be emphasized that the hook supporting lever 12 may be moved in the X-direction in unison with the feed shaft 10 regardless of the hooks X1, X2 and X3 engaged with or disengaged from the reference holes of the printed circuit boards P.

Next referring to FIGS. 5, 6, 7 and 8, the LU system will be described which feeds the new printed circuit board P4 on the conveyor rails Ra and Rb while unloading the finished printed circuit board Pf into the finished printed circuit board stocking or stacking device 5 disposed adjacent to the right end of the bed 1. First referring to FIG. 5, the printed circuit boards P1, P2 and P3 are positioned on the conveyor rails Ra and Rb with the hooks X1, X2 and X3 in the manner described above (See FIG. 5-1). The next or new printed circuit board P4 is placed on the feed rails in the printed circuit board feeding or loading device 2 while the finished printed circuit board Po is unloaded and stocked in the finished printed circuit board stocking or stacking device 5. The LU system further includes a shift lever 35 to the both ends of which are pivoted loading and unloading hooks 43 and 41, respectively.

Figure 5:
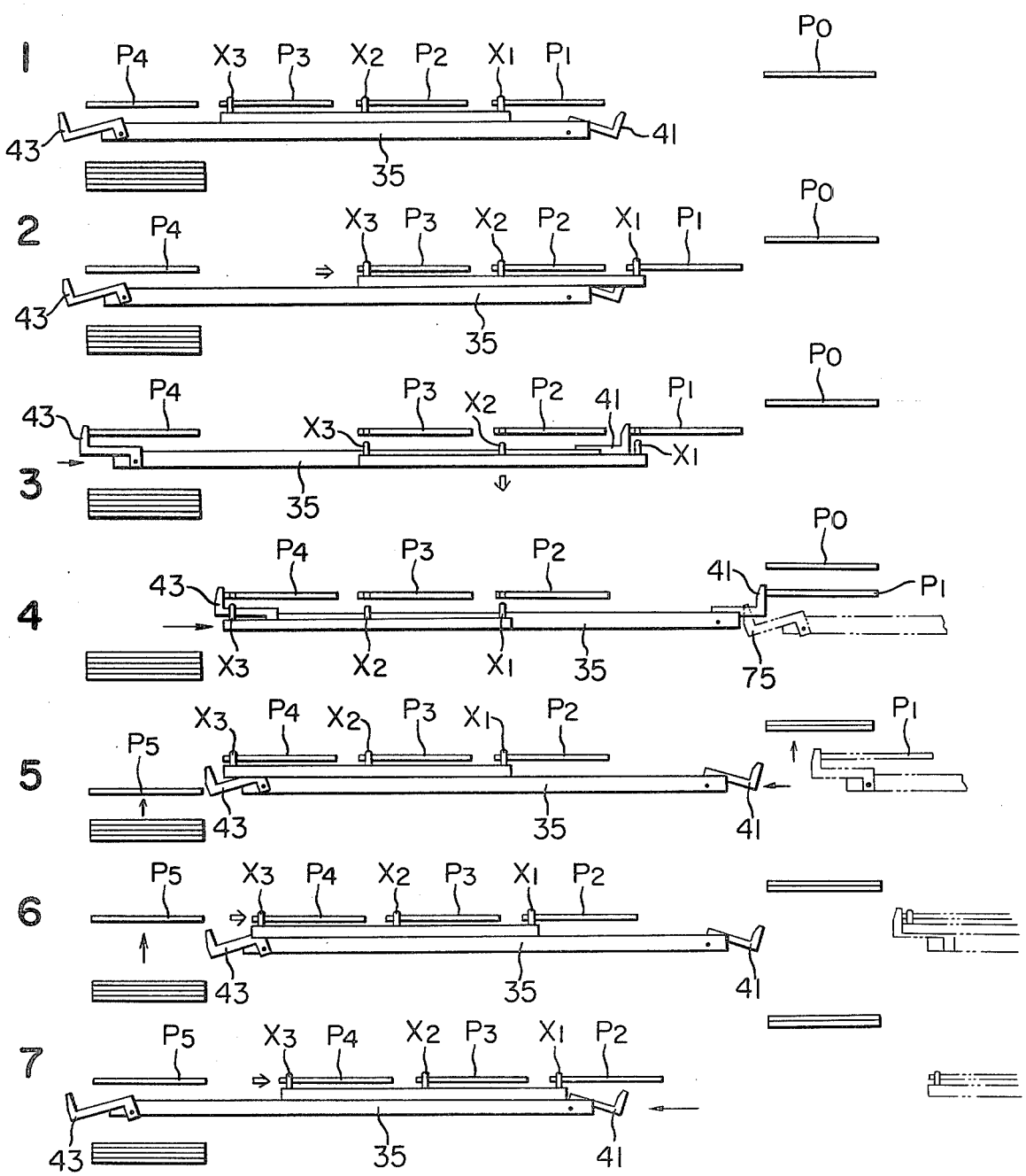
FIG. 5 is a view used for the explanation of the mode of a loading-unloading (LU) system for loading or feeding a new printed circuit board from a printed circuit board loading or feeding device onto the pair of conveyor rails from one end thereof and for unloading the finished printed board into a finished printed circuit board stocking or stacking device at the other ends of the conveyor rails.

In FIG. 5-1, the printed circuit boards P1, P2 and P3 are shown as being located at the "origin" and so is the LU system. After one cycle of part insertion operations, the hooks X1, X2 and X3 shift the printed circuit boards P1, P2 and P3 to the positions shown in FIG. 5-2. Thereafter, the hooks X1, X2 and X3 are disengaged from the reference holes of the printed circuit boards P1, P2 and P3 and retracted downwards as shown in FIG. 5-3 leaving the printed circuit boards P1, P2 and P3 in the positions in FIG. 5-2. Thereafter, the hooks X1, X2 and X3 are returned to the left to the "origin" or their initial positions. In this case, the LU system causes the loading and unloading levers 43 and 41 to move to their operative positions for engagement with the trailing edges of the printed circuit boards P4 and P1 as shown in FIG. 5-3, and then causes the shift lever 35 to move to the right. As a result, the finished printed board P1 is unloaded into the stocking or stacking device 5 while the new printed circuit board P4 is loaded onto the conveyor rails Ra and Rb at their left ends as shown in FIG. 5-4. The next printed circuit board P5 is brought to the feeding position in the feeding or loading device 2 and the loading and unloading levers 43 and 41 are retracted to their inoperative positions while the shift lever 35 is moved to the left as shown in FIG. 5-5 or 5-6. Thereafter, the engaging hooks X1, X2 and X3 are raised to engage with the reference holes of the printed circuit boards P2, P3 and P4, respectively, as shown in FIG. 5-6 so that the next cycle of part insertion operations may be started as shown in FIG. 5-7.

Figure 8:
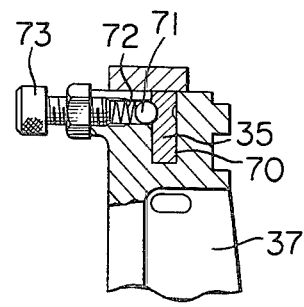

As shown in FIG. 6, the shift lever 35 is slidably supported by a pair of longitudinally spaced brackets or bearings 36 and 37 which in turn are mounted on the top of the bed 1. FIG. 8 shows in detail the support of the shift lever 35. That is, the shift lever 35 is slidably fitted into a U-shaped groove 70 formed in the top of the bearing 37 and is normally biased under the force of a spring 72 through a ball 71 so as to press against one side wall of the U-shaped groove 70, whereby the frictional force of a suitable magnitude may be exerted to the shift lever 35 when the latter is displaced. The frictional force exerted to the shift lever 35 may be suitably adjusted with an adjusting screw 73.

Referring back to FIGS. 6 and 7, a driving pulley 38 and a tension pulley 39 are rotatably mounted on the top of the bed 1, and a reversible motor 40 is drivingly coupled to the driving pulley 38. A flexible wire 66 with a tension spring 67 is extended between the pulleys 38 and 39 and wrapped therearound. More particularly, one end of the flexible wire 66 is passed around the driving pulley 38 and connected to one end of the tension spring 67 the other end of which is securely attached to a sector gear 51 rotatably mounted with a pin 52 on the shift lever 35 as best shown in FIG. 7 while the other end of the wire 66 is passed around the tension pulley 39 and is securely attached to the sector gear 51. Thus, upon rotation of the motor 40, the shift lever 35 may be translated in either direction.

As best shown in FIG. 7, the loading and unloading hooks 41 and 43 are pivoted with pivot pins 45 and 62, respectively, to the shift lever 35 at its ends. One end of each of the wires 48 and 49 is securely attached with pins 46 and 47 to the loading hook 41, while the other end of each of said wires is attached to the sector gear 51 with pins 54 and 55. In like manner, one end of each of wires 60 and 61 is securely attached with pins 63 and 64 to the unloading hook 43 while the other end of each of said wires is attached to a sector gear 57 with pins 58 and 59. The second sector gear 57 is rotatably mounted with a pin 53 on the shift lever 35 and is in mesh with the first sector gear 51.

Next, the mode of operation of the shift lever driving system with the above construction will be described. As described elsewhere, the frictional forces in suitable magnitudes are exerted to the shift lever 35 so that when the driving pulley 38 starts rotation in the direction a, the movement in the direction a of the lever 35 does not immediately follow. However, the flexible wire 66 is caused to move in the direction a so that the first sector gear 51 is caused to rotate about its pin 52 in the clockwise direction and consequently, the second sector gear 57 in mesh with the first sector gear 51 is caused to rotate in the counterclockwise direction about its pin 53. As a result, the loading and unloading hooks 41 and 43 are caused to rise or swing in the clockwise and counterclockwise directions, respectively, as indicated by the arrows a. When the rotating torque in the direction a of the driving pulley 38 is increased, the shift lever 35 is caused to move to the left or the direction indicated by the arrow a. When the driving pulley 38 rotates in the clockwise direction b, the hooks 41 and 43 are lowered and then the shift lever 35 is caused to move to the right or in the direction indicated by the arrow b.

As best shown in FIG. 6, the shift lever 35 has two projections 42 and 44 spaced apart from each other by a suitable distance in the longitudinal direction. At the end of the shift to the left, the projection 44 engages with a microswitch 68 so that the reversible motor 40 is stopped or reversed in rotation. The same is true for the projection 42.

Figure 9:
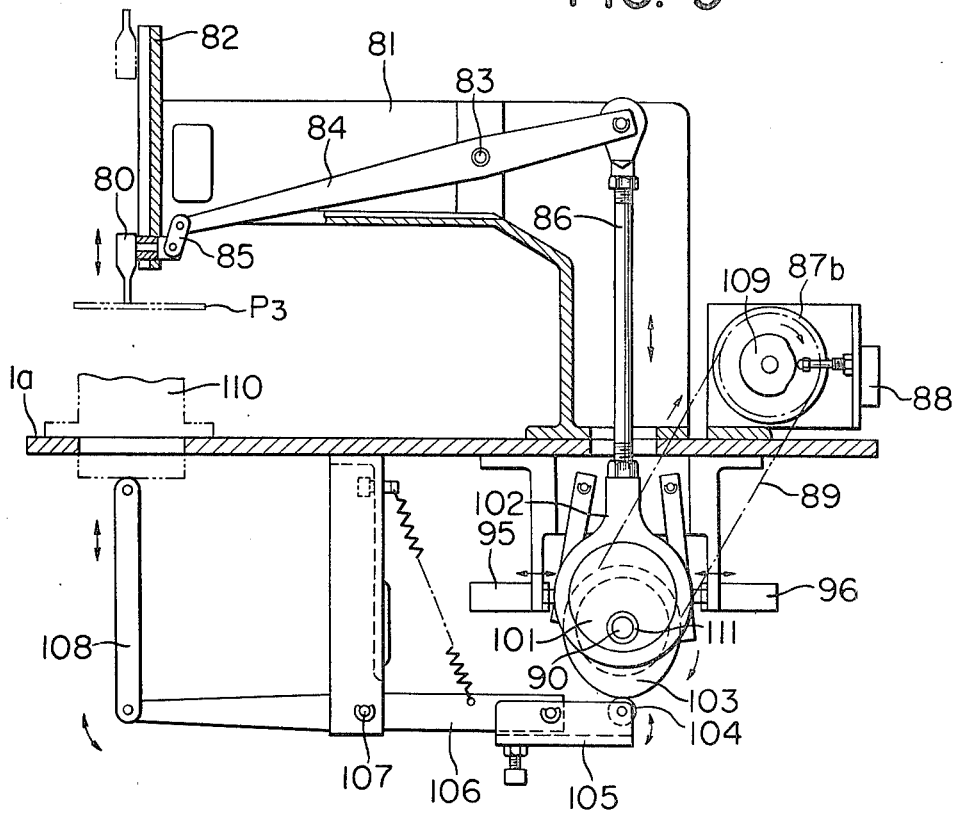
FIG. 9 shows a mechanism for causing the vertical reciprocal movement of a part insertion chuck of a part insertion head.
Figure 10:
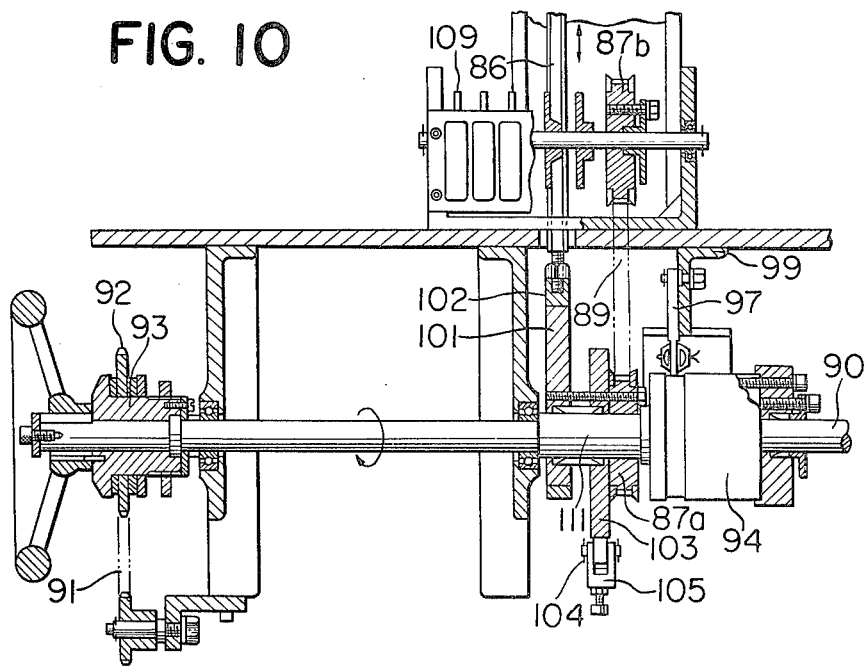
FIG. 10 is a longitudinal view of a system for transmitting the driving power to the part insertion heads.

Next referring to FIGS. 9 and 10, a mechanism for effecting the vertical movement of a chuck 80 of each of the insertion heads H1, H2, H3 and H4 will be described. The chuck 80 grips an electronic part or component and makes the vertical movement in order to insert the lead of this part or component into a specified insertion hole of the printed circuit board P as will be described in detail hereinafter.

An L-shaped frame 81 mounted on a base plate 1a and a cam plate 82, which will be described in more detail hereinafter, is mounted at the free end of the overhanging arm of the frame 81. The chuck 80 is mounted on the front face of the cam plate 82 for the reciprocal vertical movement. One end of a lever 84, which is pivoted with a pin 83 to the frame 81, is connected through a link 85 to a slider 120 to be described hereinbelow while the other end is pivoted to the upper end of a connecting rod 86 the other end of which is connected to eccentric ring 102 and wheel 101. The eccentric wheel 101 and the eccentric ring 102 are carried on the output shaft 111 of a one-way clutch 94. Thus, as the one-way clutch 94 makes one rotation, the chuck 80 makes one vertical reciprocal movement. An eccentric cam 103 and a pulley 87a are also mounted on the output shaft 111 of the one-way clutch 94. A cam follower 104 which is in engagement with the eccentric cam 103 is connected through levers 105 and 106 and a link 108 to an anvil 110 so that the vertical reciprocal movement of the anvil 110 may be effected in synchronism with that of the chuck 80. The anvil 110 has the double function of clinching the lead extended downwards through the insertion hole of the printed circuit board P against the lower surface or the circuit pattern side thereof and of detecting whether or not the lead of the part or component has been correctly inserted into the specified insertion hole. Therefore, the construction of the anvil 110 differs depending upon the construction of electronic parts or components to be mounted so that the anvil 110 is not shown in detail in FIG. 9.

The pulley 87a is drivingly coupled with a belt 89 to a pulley 87b in such a way that the rotation of a timing cam 109 carried coaxially of the pulley 87b may be precisely synchronized with that of the one-way clutch 94. That is, as the timing cam 109 makes one rotation, the one-way clutch 94 also makes one rotation. The timing cam 109 actuates a microswitch 88 as it rotates, whereby the signal representing the angular position of the one-way clutch 94 may be derived, and in response to this signal, the chuck 80 is so controlled as to stop at a specified position.

As shown in FIG. 11, the operation of the one-way clutch 94 is controlled by levers 97 and 98 pivoted to plungers, respectively, of solenoids 95 and 96 which are mounted on a bracket 99. A tension spring 100 is loaded between the levers 97 and 98 so that when the solenoids 95 and 96 are de-energized, the levers 97 and 98 are caused to move toward the disk 94. When the lower end of the lever 97 or 98 engages with the stepped portion of the disk 94, the rotation of the disk 94 is stopped as shown.

FIG. 11(a) shows the position of the one-way clutch 94 before the chuck 80 inserts the lead of an electronic part or component into a specified insertion hole of the printed circuit board P. That is, the solenoid 96 is energized so that both the levers 97 and 98 are caused to swing in the counterclockwise direction. As a result, the lower end of the lever 97 engages with the stepped portion of the disk 94', thereby stopping the rotation thereof. FIG. 11(b) shows the position of the one-way clutch 94 before the chuck 80 receives an electronic part or component from a feeding means. The solenoid 95 is energized so that the levers 97 and 98 are caused to swing in the clockwise direction. As a consequence, the lower end of the lever 97 disengages from the stepped portion of the disk 94' so that the latter is permitted to rotate through 180° until the disk 94' is arrested again by the engagement of the lower end of the lever 98 with the stepped portion of the disk 94'. Since the construction of the one-way clutch 94 of the type described above is well known to those skilled in the art and its standardized version is readily available in the market, no further description shall be made thereto in this specification.

Referring back to FIG. 10, a driving shaft 90 is extended through all the four part insertion heads H1, H2, H3, and H4 and through the output shafts 111 of the one-way clutches 94 thereof. A chain sprocket 92 is attached through a torque meter 93 to one end of the shaft 90 and is drivingly coupled with a chain 91 to a motor (not shown), whereby the shaft 90 is normally driven. In each of the insertion heads H1, H2, H3 and H4, a ring 112 is securely fitted over the shaft 90 and is drivingly coupled to the input ring of the one-way clutch 94.

Figure 13:
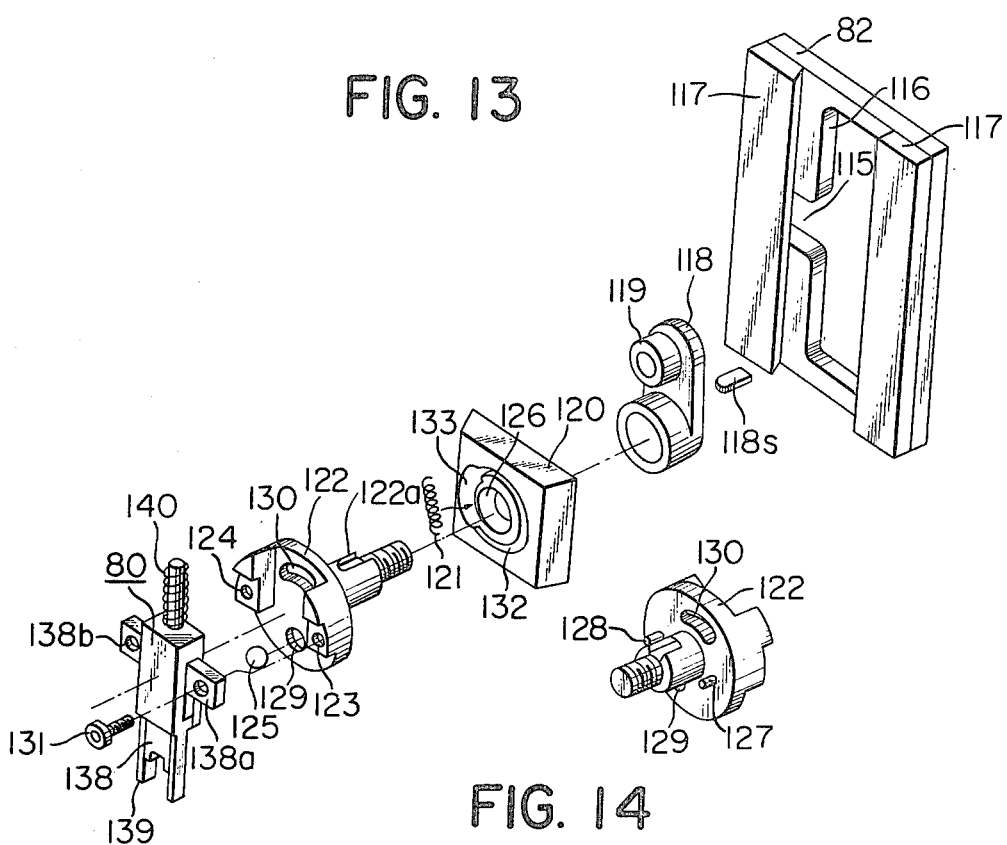
FIG. 13 is a perspective, exploded view of the mechanism shown in FIG. 12.

As shown in FIG. 13, the cam plate 82, which is attached to the free end of the overhanging arm of the frame 81 (see FIG. 9), is assembled with guide plates 117 so as to define dovetail grooves which serve as the guides for the vertical slidable movement of a slider 120. The cam plate 82 is formed with an opening which in turn defines cam surfaces 116, which are vertically straight, and a recess 115 between the cam surfaces 116. A shaft 122a is extended coaxially of a disk 122 and is fitted through a center shaft opening or hole 126 of the slider 120 and keyed with a key 118s to a crank 118 with a roller 119. The crank 118, the slider 120 and the disk 122 are held together with a nut which is screwed on the externally threaded end of the shaft 112a of the disk 122 in such a way that the crank 118 and the disk 122 may be rotatable relative to the slider 120. The front face of the disk 122 has tapped holes 123 and 124 for mounting the chuck 80 with bolts 131. Pins 127 and 128 for retaining a spring 121 are extended from the rear face of the disk 122. The disk 120 is formed with an opening 130 through which the spring 121 is loaded into the slider 120 and an opening 129 through which a ball 125 may freely pass.

Figure 14:
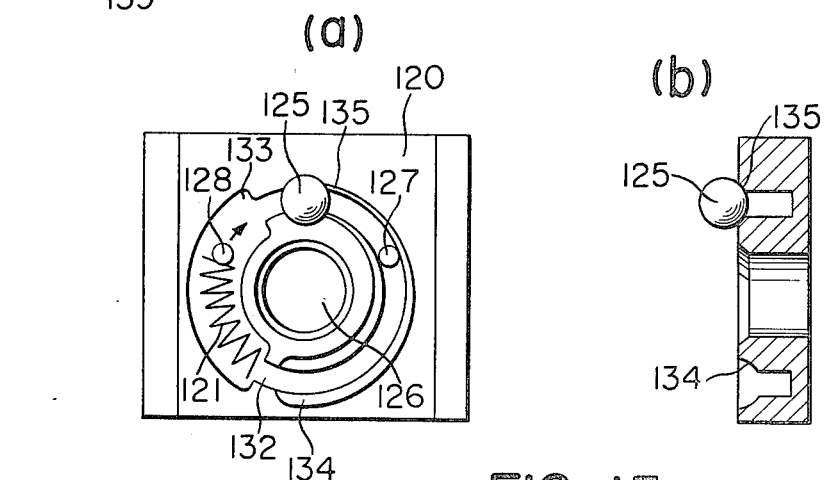
FIGS. 14 and 15 are views used not only for the explanation of mode of operation of a bias spring which is used for imparting the torques for inverting the part insertion chuck but also for the explanation of the mode of locking a slider with a part insertion mounting disk with a steel ball.
Figure 15:
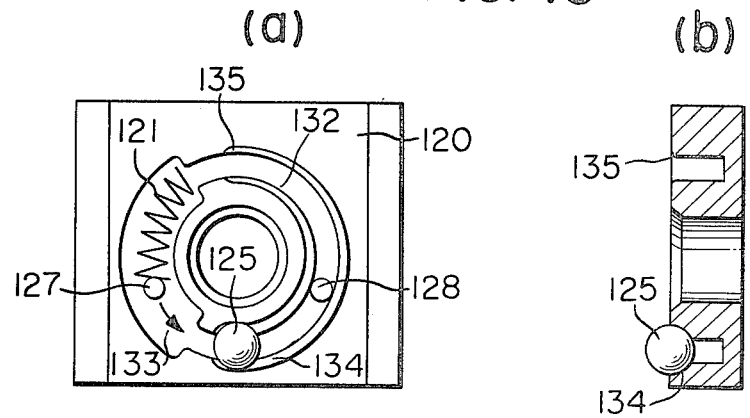

Referring to FIGS. 14 and 15, the slider 120 is formed with an annular groove 132 which is coaxial with the center shaft hole 126 and is enlarged as shown at 133. A race 134–135 is formed partly along the annular groove 132 in such a way that the depth of the race along which the ball 125 rolls is progressively increased from one end 135 toward the other end 134. The spring 121 is loaded in the enlarged portion 133 of the annular groove 132 in such a way that the spring 121 may be slightly compressed. When the disk 122 is rotated relative to the slider 120, the pins 127 and 128 extended from the rear surface thereof are revolved along the annular groove 132 and engage with the spring 121 so as to compress it further. As a result, the pin 127 or 128 receives the reaction force from the spring 121. That is, when the pin 128 revolves and engages with the spring 121 so as to compress it, the pin 128 revolves and engages with the spring 121 so as to compress it, the pin 128 is forced to rotate in the clockwise direction as shown in FIG. 14. In like manner, when the pin 127 compresses the spring 121, it is forced to revolve in the counterclockwise direction as indicated by an arrow in FIG. 15.

Referring to FIG. 12, when the slider 120, which is assembled with the disk 122 and coupled with the lever 84 (see FIG. 9), is caused to move vertically along the dovetail grooves defined between the guide plates 117 and the cam plate 82, the roller 119 on the crank 118, which is coupled to the shaft 122a of the disk 122, is exerted with the torque in the clockwise direction in the upper half stroke and with the torque in the counterclockwise direction in the lower half stroke and is pressed against the cam surfaces 116 so as to roll over it. When the roller 119 drops into the recess 115 at the midpoint of the stroke of the slider 120, and comes out of it, the crank 118 and hence the disk 122 are caused to rotate through 180°. Thus, the chuck 80, which is mounted on the front face of the disk 122, is directed upwards during the upper half stroke and downwards during the lower half stroke.

The chuck 80 shown in FIGS. 12 and 13 is of the type adapted for the insertion of the lead of an axial type electronic component such as a resistor, a diode or the like, having the leads extended lengthwise. It comprises an outside former 139 for forming the leads of an electronic component or part 141 into a suitable shape and gripping them, arms 138a and 138b formed integral with the outside former 139, a pusher 138 for pushing the part 141 out of the outside former 139, and a spring 140 loaded between the outside former 139 and the pusher 138. The rear surface of the outside former 139 is formed with a groove 137 along which rolls the steel ball 125.

The chuck 80 is mounted on and securely held to the front face of the disk 122 with the bolts 131 extended through the holes of the arms 138a and 138b and screwed into the tapped holes of the disk 122 (see FIG. 13). In FIG. 12, in the upper position, the chuck 80 is directed to receive the part 141 so as to form the leads thereof while in the lower position, it is directed downwards so as to insert the leads of the part 141 into the specified insertion holes of the printed circuit boards P3. When the downwardly directed chuck 80 is moved downwards so as to insert the leads of the component 141 into the specified insertion holes of the printed circuit board P3, the chuck 80 engages with a stopper 136 immediately before the leading ends of the outside former 139 engages with the printed circuit board P3 so that the further downward movement of the chuck 80 is prevented. However, the pusher 138 is permitted to further move downwards in unison with the slider 120, thereby pushing the part 141 out of the outside former 139 while compressing the spring 140. In this case, the steel ball 125 is driven toward the end 134 of the race where it has the deepest depth so that the disk 122 will not exert the force through the steel ball 125 to the outside former 139 so as to cause it to move downwards.

In the upper position, the chuck 80 receives the part 141 and forms the leads thereof with the outside former 139 and a stationary former or die 142. In this case, the steel ball 125 is driven toward the end 135 of the race so that it floats out of it. As a result, the steel ball 125 is partly passed through the hole 129 of the disk 122 and fitted into the groove 137 in the rear surface of the outside former 139, whereby the disk 122 and the outside former 139 are locked together.

Thus, the downward movement of the outside former 139 may be prevented when it is coacting with the stationary former or die 142 so as to shape the leads of the part 141.

Figure 16:
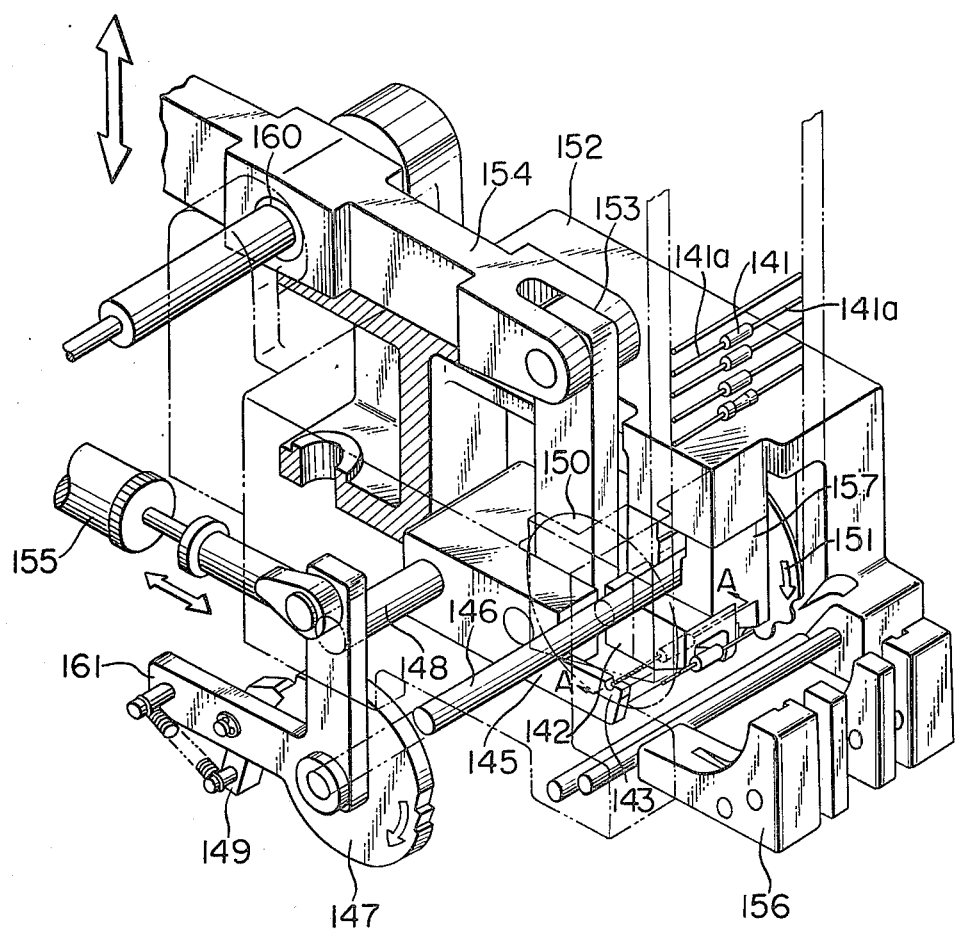
FIG. 16 is a perspective view, partly broken, of a device for separating an axial type part from tapes between which are bonded or otherwise attached a large number of axial type parts in parallel with each other and for feeding the separated part to the part insertion chuck.

Next referring to FIGS. 16 and 17, a device for separating electronic components one at a time from a tape upon which are arranged many so-called axial type electronic components in such a way that the axes are in parallel with each other in the transverse direction of the tape and feeding the separated part into the chuck 80 will be described. (This device will be referred to as "the part feeding device" hereinafter for brevity in this specification). The part feeding device has a frame 152 through which is extended a rotary shaft 146 carrying a ratchet wheel 147 at one end thereof. The free end of the piston rod of an air cylinder 155 is pivoted to one end of an oscillating lever 161 to which is pivoted a click 149 so that as the air cylinder 155 is actuated to reciprocate its piston rod, the click or pawl 149 acts on the teeth of the ratchet wheel 147, thereby intermittently rotating it and hence the shaft 146. The rotary shaft 146 also carries a pair of sprocket wheels 150 and 151 which are arranged and spaced apart from each other in such a manner that their teeth may engage with the leads 141a of parts 141 on the tapes or strips. Therefore, as the sprocket wheels 150 and 151 are intermittently driven, the parts 141 on the tapes may be advanced by one pitch and fed below ghe stationary former or die 142, and an upper cutter 157. A lower cutting blade 145 is pivoted with a pivot pin 148 to the frame 152 and is coupled through a link 153 to a lever 154. The lever 154 is pivoted with a pivot pin 160 so as to swing about it and has its rear end connected to the lever 84 (see FIG. 9).

As shown in FIG. 17(a), as the chuck 80 is lifted, the lever 154 simultaneously lifts the lower cutter blade 145 so as to cross the upper cutting blade 157 immediately before the chuck 80 reaches the part 141, thereby cutting off the leads of the part 141 from the tapes. Thereafter, the lower cutting blade 145 is further lifted toward the former or die 147, thereby starting the forming of the leads 141a of the separated part 141 as shown in FIG. 17(b). The chuck 80 is lifted past the lower cutting blade 145 so that the leads 141a of the separated part 141 may be completely formed into a specified shape between the outside former 139 and the stationary former or die 142 as shown in FIG. 17(c). When the outside former 139 of the chuck 80 is reversed to move downward, the formed leads 141a of the separated part 141 spring back to press against the legs of the outside former 139 so that the separated part 141 may be held by and moved down in unison with the outside former 139.

FIG. 18 shows the steps for clinching the leads 141a of the part 141, which are inserted through the specified insertion holes of the printed circuit boards P3 and extended downwards therefrom against the circuit pattern side of the printed circuit board P3.

As shown in FIG. 18(a), the part 141, which is held between the legs of the outside former 139 due to the springing back of the leads 141a thereof, is moved downwards in unison with the outside former 139. As soon as the leading ends of the legs of the outside former 139 have reached the upper surface of the printed circuit board P3 as shown in FIG. 18(b), the further downward movement of the outside former 139 is prevented as it engages with the stopper 136 as described elsewhere, but the downward movement of the pusher 138 is continued so that it pushes the part 141 out of the outside former 139, thereby inserting the leads 141a of the part 141 into the specified insertion holes of the printed circuit board P3. Spontaneously, the anvil 144, which is located below the printed circuit board P3, is raised in the manner described above so as to engage with the circuit pattern side of the board P3 as shown in FIG. 18(b), thereby supporting the printed circuit board P3. Therefore, the leads 141a of the part 141 extended downwards from the printed circuit board P3 are clinched against the lower surface or the circuit pattern side of the board P3 as shown in FIGS. 18(c) and (d). In order to facilitate the clinching operation, the anvil 144 is formed with suitable recesses 144a and 144b.

FIG. 19 shows the steps of mounting the part 141 on the printed circuit board P3 in such a manner that the part 141 may be spaced apart upwardly of the board P3 by a suitable distance in order to facilitate the dissipation of heat from the part 141 during operation. Therefore, the pusher 138 and the stationary former or die 142 are different in construction from those shown in FIG. 18 in that they are formed with stepped portions.

As shown in FIG. 19(a), the stationary former or die 142 is formed with projections 142a and 142b which are directed downwards. The legs 138a and 138b of the pusher 138, which is slidable inside the outer former 139 between its legs 139a and 139b, are stepped in such a way that when the chuck 80 has reached its upper stroke end, the legs 139a and 139b of the outside former 139, the legs 138a and 138b of the pusher 138 and the stationary former or die 142 may define spaces substantially equal in dimension to the legs 141a and 141b of the part 141 as shown in FIG. 19(b). As a result, the leads 141a and 141b of the part 141 are so formed as to have stepped portions as shown in FIG. 19(b). After the forming step, the leads 141a and 141b of the part 141 spring back against the legs 139a and 139b of the outside former 139 and the legs 138a and 138b of the pusher 138, whereby the part 141 may be held between them. Thereafter, the chuck 80 is directed downwards and moved toward the printed circuit board P3 as shown in FIG. 19(c) so that the formed leads 141a and 141b of the part may be inserted into the specified insertion holes 162a and 162b of the printed circuit board P3. When the leads 141a and 141 are inserted, the stepped portions 141c and 141d of the leads 141a and 141b engage with the upper surface or the component side of the printed circuit board P3 so that the part 141 may be floated therefrom as shown in FIG. 19(d). The leads 141a and 141b which are extended through the insertion holes 162a and 162b are clinched against the circuit pattern side or the lower surface of the printed circuit board P3 in the manner described hereinbefore.

Next, the device for mounting electronic parts such as IFTs each with leads extended downwards from its bottom will be described with reference to FIG. 20. The parts are releasably loaded into a magazine 165 which have the inner guide grooves so that the parts may be stacked vertically. A plurality of such magazines 165 are uprightly mounted on a drum-shaped holder 166 and spaced equiangularly along the periphery thereof.

A disk 181 is carried by the shaft 190 of the drum-shaped holder 166 coaxially thereof as shown in FIG.

21. The periphery of the disk 181 is terminated into a ring 181a. Alternatively, the ring 181a is attached to the periphery of the disk 181. The ring 181a is formed with a plurality of equiangularly spaced apart recesses, 182, which are opened both at the upper and lower annular surfaces of the ring 181a. The depth of each of these recesses 182 is nearly equal to the height of the electronic part loaded in the magazine 165; its width is slightly greater than that of the part 183 and is nearly equal to the width of the magazine 165. The part 183 drops by its own weight into the recess 182 and is received therein.

Figure 23:
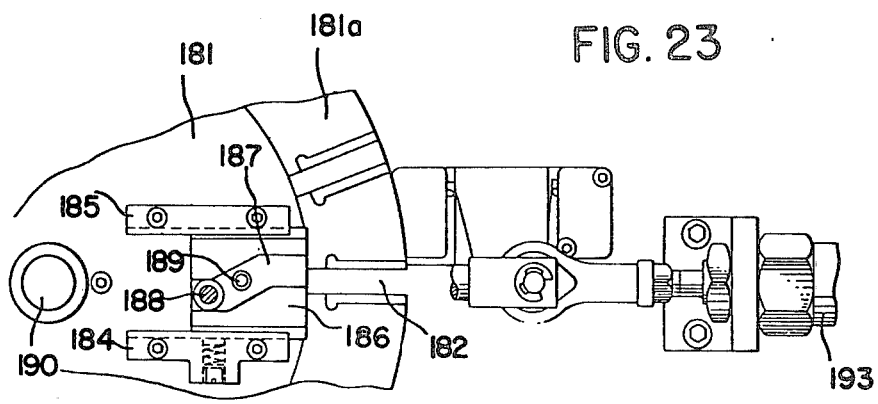

As shown in FIG. 23, a pair of parallel guides 184 and 185 are mounted on the top of the disk 181 so as to guide the slidable movement of a grooved cam 186 with a zig-zag cam groove 187. A cam follower 188 is extended from the bottom of the holder 166 and is slidably fitted into the cam groove 187.

Figure 24:
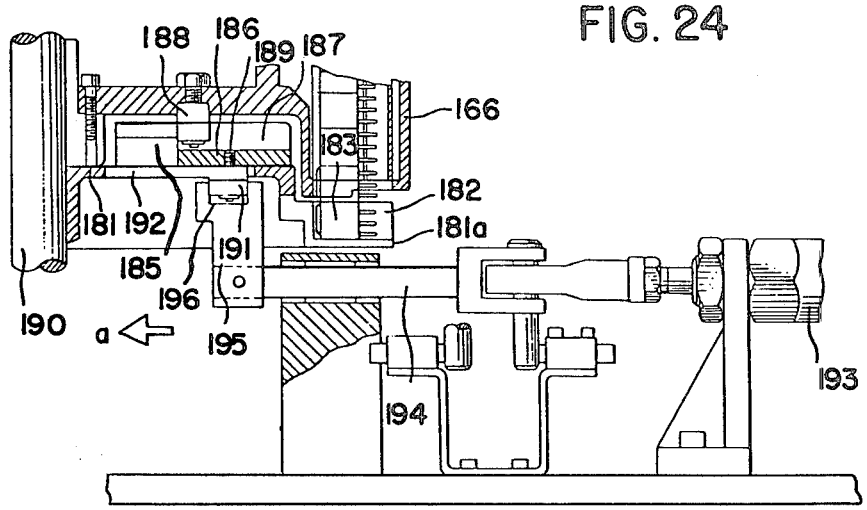

As shown in FIG. 24, a cam follower or a roller 191 is rotatably mounted with a shaft 189 on the bottom of the grooved cam 186 and extended through a slit 192 formed through the disk 181. The piston rod of an air cylinder 193 is connected through a link 194 to a block 195 which is located below the disk 181 and formed with a recess 196 into which is fitted the cam follower or roller 191. A chuck 180 operates in the manner described above and an anvil 179 is disposed for clinching the leads of a part 183 in the manner described elsewhere.

Figure 22:
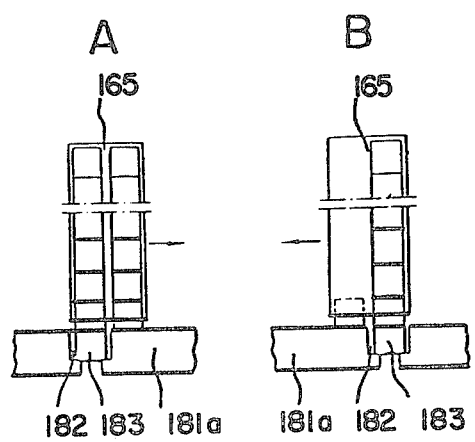

Next, the mode of operation will be described. As the disk 181 makes one rotation about its shaft 190, the cam follower roller 191 makes one engagement with the recess 196 in the block 195. When the air cylinder 193 is actuated so that the block 195 is displaced in the direction indicated by the arrow a, the groove cam 186 is also shifted in the same direction. As a result, the cam follower 188 which is fitted into the cam groove 187 of the cam 186 is displaced circumferentially by a distance substantially equal to the distance between the circumferentially spaced straight groove portions of the zig-zag cam groove 187. Consequently, the magazine holder 166 is angularly displaced with respect to the disk 181 through the same angle as the angle of displacement of the cam follower 188. This angular displacement of the magazine holder 166 is effected when all the parts loaded in one chamber in one magazine 165 are exhausted or emptied. Therefore, the bottom of the other chamber of the magazine 165 may be aligned with the recess 182 as shown in FIG. 22.

Referring to FIG. 25, a pin 199 is extended from the disk 181 radially outwardly thereof so as to actuate a microswitch 200 disposed externally of the disk when the cam follower or roller 191 engages with the recess 196 of the block 195. Thus, the timing when the roller 191 drops into the recess 196 may be detected. A light emitting means 197 is disposed radially inwardly of the ring 181a while a light reception means 198 is disposed radially outwardly thereof in such a way that the light beam emitted from the light emitting means 197 may reach the light reception means 198 through one of the recesses 182 when it is emptied. Thus, upon detection of the light beam by the light reception means 198, the signal is generated so as to actuate the air cylinder, whereby the magazine chamber or the magazine which has been emptied may be switched in the manner described above.

Next, referring to FIGS. 26, 27 and 28, the device and method for pulling the part 183 from the recess 182 of the ring 181a and turning it through 90° so that it may be held upright with its leads directed downwards so as to be delivered to the chuck 180 will be described. As best shown in FIG. 26, the parts 183 are stacked horizontally in the magazine 165 with the leads directed horizontally.

First, a pusher 170 pushes the part 183 out of the recess 182 of the ring 181a radially outwardly as indicated by the arrow in FIG. 26 into a rotary chuck 205 so that the part 183 may be gripped by a plurality of equiangularly spaced resilient pawls 206 of the chuck 205. In order to cause the movement of the pusher 170, the driving shaft of a motor 171 is coupled through a cam wheel 167, a connecting rod 168 and a link 208 to the pusher 170. (see FIG. 20). The chuck 205 is carried by a crankshaft or crank 176 which in turn is rotatably carried by a shaft 202 supported by horizontally spaced bearings 173 and 177 as best shown in FIG. 27. The shaft 201 of the crank 176 is extended through the right bearing 173 and carries at its free end a gear 175 in mesh with a sector gear 174 which in turn is drivingly connected through a connecting link 169 to the cam wheel 167 (See FIG. 20). A bevel gear 204 is attached to the chuck 205 coaxially thereof at the end opposite to the resilient part gripping pawls 206 and is in mesh with a bevel gear 203 carried by the shaft 202 for rotation therewith. The shaft which is rotatable relative to the bearings 173 and 177 and the crank 176 has its one end remote from the gear 175 coupled to an electromagnetic brake 178 so that when the latter is energized, the rotation of the shaft 202 is not permitted.

When the connecting rod 169 is displaced in the direction indicated by the arrow B in FIG. 28, the sector gear 174 is caused to rotate in the counterclockwise direction about its axis so that the gear 175 in mesh therewith is caused to rotate in the clockwise direction as indicated by the arrow B. Consequently, the rotary chuck 205 is moved from the vertical position shown in FIG. 27 to the horizontal position shown in FIG. 26 without any rotation about its axis when the electromagnetic brake 178 is de-energized so that the free rotation of the shaft 202 is permitted. However, when the electromagnetic brake 178 is energized so that the rotation of the shaft 202 is locked, the bevel gear 203 is held stationary. As a result, the bevel gear 204 in mesh with the bevel gear 203 is caused to rotate when the crank 176 is moved from the vertical position to the horizontal position in the manner described above so that the rotary chuck 205 is caused to rotate about its axis through 90°. The rotation of the rotary chuck 205 through its axis is required in order to control the position of the part 183 when the leads of the latter are inserted into the specified insertion holes of the printed circuit board P (not shown). A ball 207 which is spring loaded is pressed against the rotary chuck 205 so as to eliminate the slippage of the chuck 205 when the latter is rotated through its axis. The part 183 which is gripped by the resilient part gripping pawls 206 of the rotary chuck 205 and is brought to the vertical position shown in FIG. 27, is pulled out of the pawls 206 and its leads are inserted into the specified insertion holes of the printed circuit board P by a device to be described below.

Next referring to FIGS. 29, 30 and 31, a part insertion chuck which receives the part 183 from the rotary chuck 205 and inserts the leads of the part 183 into the specified insertion holes of the printed circuit board P will be described. The part insertion chuck is mounted on the disk 122 (See FIG. 13) with the bolts 131 as described hereinbefore with reference to the axial type part insertion chuck 80. A main body 210 is formed with a cylinder bore 219 in which slidably reciprocates a piston 212. The part gripping fingers 215 and 216 are pivoted with pivot pins 213 and 214 to the main body 210. The upper ends of the part gripping fingers 215 and 216 are pivoted to one end of links 211 the other ends of which are pivoted to the piston 212, which is loaded with a compression spring 217. Therefore, the piston or piston rod 212, the links 211 and the part gripping fingers 215 and 216 form a toggle mechanism so that when the piston rod 212 is forced downwards under the force of the compression spring 217, the part gripping fingers 215 and 216 can firmly grip the part 183. When the compressed air is charged through a compressed air passage 218 extended through the shaft of the disk 122 into the cylinder bore 219 below the piston, the piston rod 212 is forced upwards against the compression spring 212, whereby the part gripping fingers 215 and 216 are opened to release the part 183.

FIG. 32 shows an IC chip insertion head. A plurality of IC magazines 220, into which are loaded IC chips, are equiangularly mounted on a drum 220 around the periphery thereof so that the IC chips may be delivered one by one from a delivery or feed position 223. An IC chip insertion chuck 228 picks up and grips the IC chip fed to the feeding position 223 so as to insert the leads of the IC chip into the specified insertion holes of the printed circuit board P which is brought into engagement with an anvil 229 in a manner substantially similar to that described elsewhere.

The IC chips 232, 233, . . . are stacked in the magazine 220 and the loaded magazines 220 are mounted on the drum as shown in FIG. 33. It is seen that the lowermost IC element 232 is biased radially inwardly by a flanged pin 230 which is loaded with a biasing spring 231 so that the chip 232 may be prevented from dropping from the magazine 220.

FIG. 34 shows the pin 230 which is pulled radially outwardly by a means to be described below away from the IC element 232 so that the latter drops onto the top surface of the annular flange 238 of a disk 237 which is held stationary. A cover 236 is attached to the vertical outer wall of the annular flange 238 of the stationary disk 237 as best shown in FIG. 34 so that the IC chip 232 on the annular flange 238 may not fall radially outwardly. Alternatively, the cover 236 may be attached to the drum 221.

When the drum 221 is rotated stepwise through a predetermined angle, the IC chip 232 slides over the top of the annular flange 238 to the feeding position 223 as shown in FIGS. 35 and 36. At the feeding position 223, the IC chip 232 drops onto a stopper 240 until the lowermost pair of leads of the IC chip 232 engage with the stopper 240. In this case, the next lowermost IC chip 233, which is located immediately above the IC chip 232, is clamped between the drum 221 and the pin 230 so that the IC chip 233 may be prevented from dropping onto the annular flange 238. The IC chip in the delivery position 223 is picked up by a means to be described below. It is to be emphasized that even when the IC chip 223 is not picked up and the drum 221 is rotated manually, the IC chip 232 rides over an inclined surface 238S contiguous with the top surface of the annular flange 238 so that no jamming problem or the like will occur.

Next referring to FIGS. 37 and 38, the device for pulling the IC chip clamping pin 230 radially outwardly, thereby dropping the IC chip onto the annular flange 238 in the manner set out above will be described. Since the flanged pin 230 is mounted on the drum 221, it can rotate stepwise in unison with the drum 221. As best shown in FIG. 37, slightly before the pin 230 reaches the IC chip delivery position 223, its flange 224 is caused to pass through inclined grooves 243 and 244 formed in the opposing surfaces of levers or guide members 241 and 242. These grooves 243 and 244 are so arranged that when the flange 244 of the clamping pin 230 passes through them, it is caused to move radially outwardly. Consequently, the clamping pin 230 is caused to move radially outwardly away from the lowermost IC chip 232 so that the latter may be permitted to drop on the annular flange 238 as described hereinbefore. The upper and lower guide members 241 and 242 are assembled into a unit which may be moved toward or away from the drum 221 along a guide rail 246 laid on a base 245.

Figure 39:
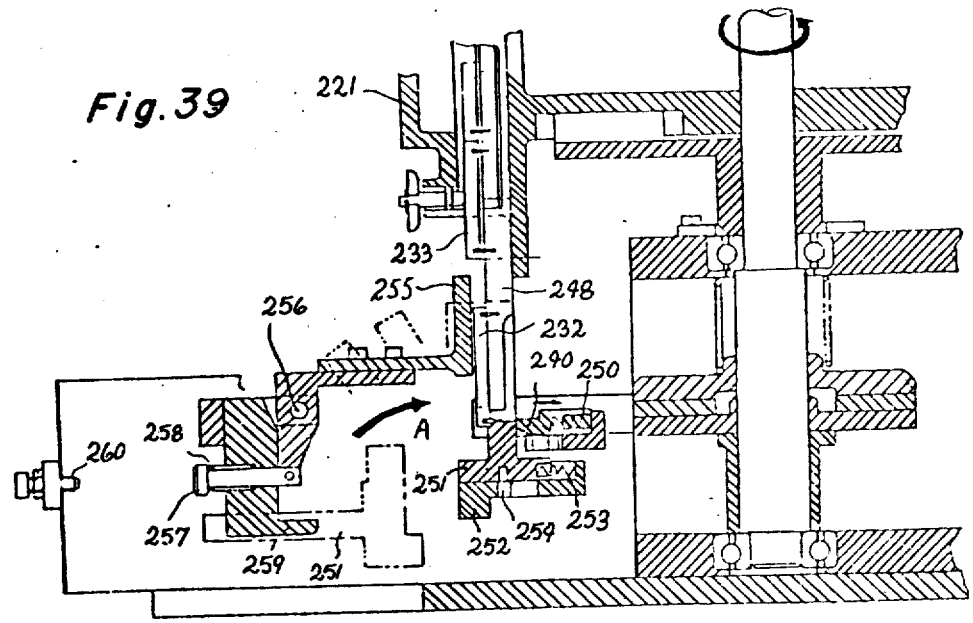
Figure 40:
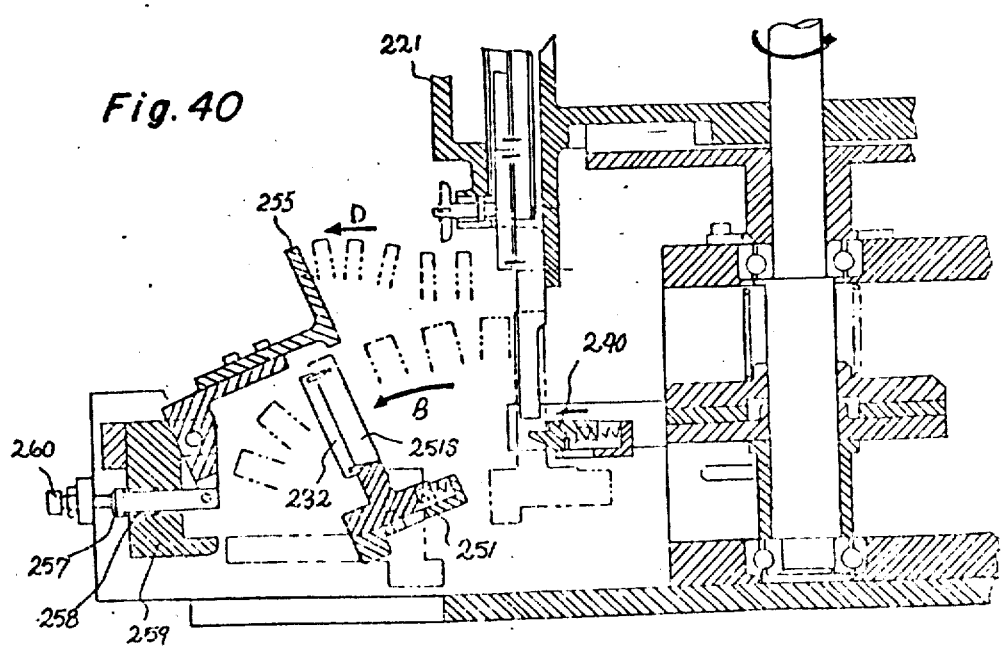
Figure 41:
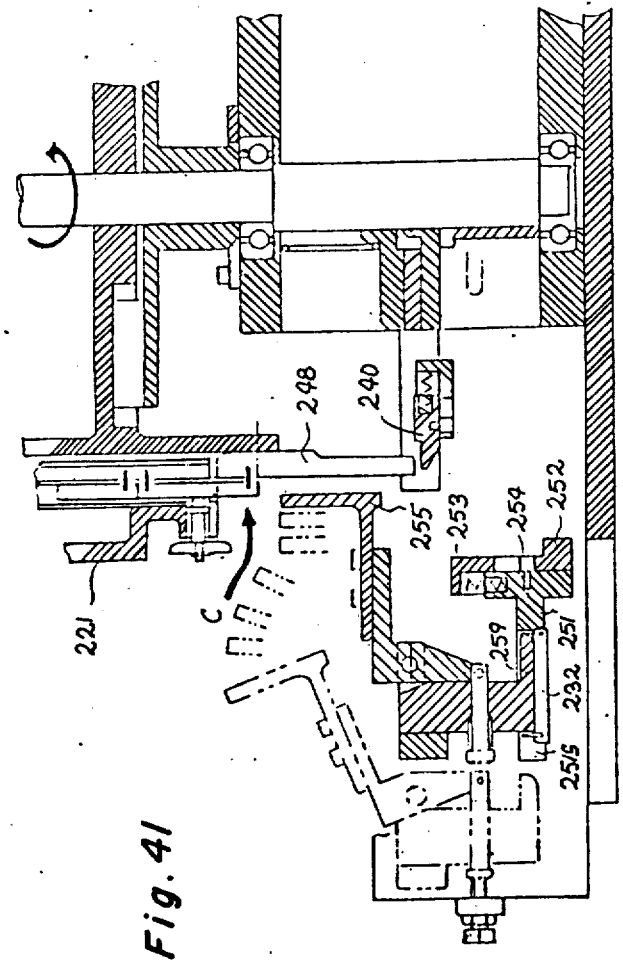

Referring to FIGS. 39, 40 and 41, the IC chip 232 which is delivered to the delivery position 223 and dropped onto the stopper 240 is picked up by a catcher 251 and positioned horizontally so as to be delivered to the chuck.

When the IC chip 232 drops on the stopper 240 at the delivery position 223, it rides on a guide bar 248 with the leads of the IC chip 232 directed radially inwardly. In order to prevent the IC chip 232 from falling radially outwardly away from the guide bar 248, a supporting member 255 is located so as to engage with the radially outwardly directed surface of the IC chip 232. In FIG. 39, the catcher 251 indicated by the two-dot chain lines, is rotated in the direction indicated by the arrow A and then advanced horizontally so that the U-shaped IC chip gripping member 251S may be fitted over the leads of the IC chip 232. The leads of the IC chip 232 are previously so arranged as to extend slightly outwardly, but when they are gripped by the U-shaped gripping member 251S, they are forced inwardly so that they spring back to press against the U-shaped IC chip gripping member 251S and consequently the IC chip 232 may be clamped between the legs of the U-shaped IC chip gripping member 251S. The stopper 240 is normally biased under the force of a bias spring 250 so as to extend radially outwardly, but when the catcher 251 moves to its position described above for gripping the IC chip 232, it pushes the stopper 240 radially inwardly against the bias spring 250.

Thereafter, as indicated by the arrow D, the supporting member 255 which is pivoted with a pin 256 to a base 259 is moved away from the IC chip 232 in unison with the base 259 and then the catcher 251 is also horizontally moved away from the drum 221. When the base 259 is moved away from the drum 221 by a predetermined distance, a stopper 260 engages with a stopper 260 which is mounted on the base 259 and biased under the force of a spring 258 radially outwardly. As a result, the pin 257 is caused to move radially inwardly against the bias spring 258. Since the inner end of the pin 257 is pivoted to the lower end of the supporting member 255, the latter is caused to swing about the pivot pin 256 in the counterclockwise direction so as to permit the free rotation of the catcher 251 with the IC chip 232 in the counterclockwise direction indicated by the arrow B in FIG. 40. When the U-shaped IC chip gripping member 251S of the catcher 251 is brought to the horizontal position, the base 259 is moved toward the drum 221 so as to overlie the upper surface of the IC chip 232 between its leads directed upwards as shown in FIG. 41. In this case, the supporting member 255 is moved as indicated by the arrow C, toward the drum 221 so as to support the IC chip which is delivered to the delivery position as the drum 221 is rotated stepwise.

The base 259 and the catcher 251 are operatively coupled with connecting rods 226 and 227 to the cam 222 so that the above described movements may be effected. The movements of the catcher 251 may be effected by a mechanism similar to that described elsewhere with particular reference to FIG. 12 so that no further description of the mechanism for driving the catcher 251 in the manner described above shall be made in this specification.

The sliding movement of the catcher 251 is guided by a guide 252, and its stroke is limited by a pin 254 extended from the catcher 251 and slidably fitted into a slit 252S formed through the guide 252. Furthermore, the catcher 251 is loaded with a spring 253 so as to be normally located at the position indicated in FIG. 43.

Figure 42:
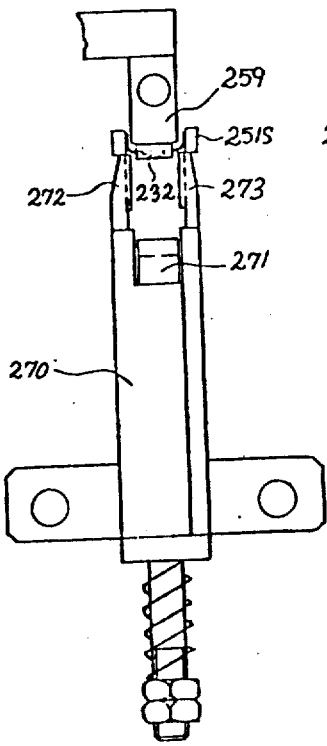
Figure 43:
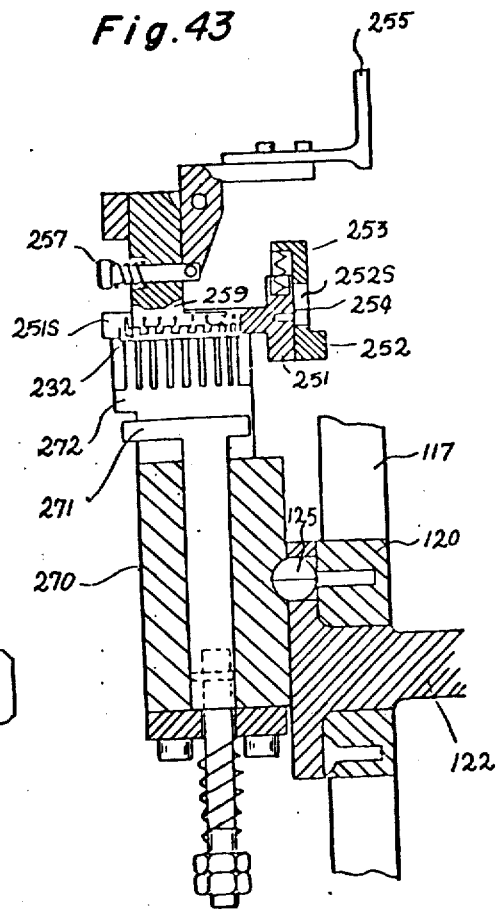
Figure 44:
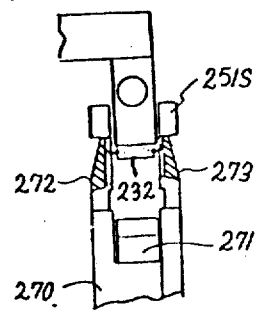
Figure 45:
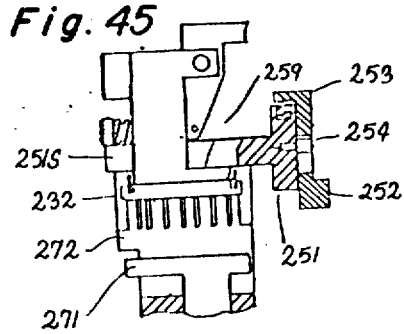

Next, referring to FIGS. 42, 43 and 44, the devices and steps for transferring the IC chip 232 from the catcher 251 to an IC chip insertion chuck 270, which corresponds to the chuck 228 shown in FIG. 32, will be described. As described above, the IC chip 232 is gripped by the U-shaped IC chip gripping member 251S of the catcher 251 with the upper surface of the IC chip 232 brought into close contact with the lower surface of the base 259. As the IC chip insertion chuck 270 is raised vertically, the upper ends of the legs 272 and 273 of an outside former of the chuck 270 engages with the catcher 251 and pushes it upwards against the bias spring 253 so that the leads of the IC chip 232 are forced to fit into the guide grooves formed in the opposing inner surfaces of the legs 272 and 273 of the outside former. Since the leads of the IC chip 232 spring back against the guide grooves, the IC chip 232 is now gripped between the legs 272 and 273 of the outside former. Thereafter, the IC chip insertion chuck 270 is moved downwardly and during this downward movement it is rotated through 190° so that the upwardly directed legs 272 and 273 of the outside former are now directed downwards. As the leading ends of the legs 272 and 273 engages with the upper surface of the printed circuit board P (not shown), the further downward movement of the outside former is prevented, but the further downward movement of a pusher 271 is permitted so that it pushes the IC element 232 downwards. The leads of the IC chip 232 slide along the guide grooves of the legs 272 and 273 and are inserted into the specified insertion holes of the printed circuit board P (not shown). Thereafter, the pusher 271 coacts with an anvil (not shown) so as to clinch the leads extended downwards through the printed circuit board P against the circuit pattern side thereof in the manner described hereinabove. Thus, the IC chip 232 may be securely mounted on the printed circuit board P.

Next, referring to FIG. 46, the printed circuit board loading or feeding device disposed adjacent to the left end of the bed 1 (See FIG. 1) for loading the printed circuit boards P4, P5, P6, . . . one by one onto the conveyor rails Ra and Rb, will be described in more detail. A pair of parallel supporting frames or plates 302a and 302b are supported by legs 301. An elongated U-shaped bracket 303 bridges the supporting frames or plates 302a and 302b adjacent to their one ends, and a rail 306 is mounted between the upright walls of the bracket 303.

Brackets 310 and 330 are mounted on the supporting frames or plates 302a and 302b adjacent to their other ends at right angles thereto. Parallel guide rods 309a and 309b are extended from the bracket 310 in parallel with the supporting frame or plate 302a while, in like manner, parallel guide rods 309c and 309d are extended from the bracket 330. Rails 308 and 331 are slidably mounted on these guide rods 309a and 309b and 309c and 309d respectively, and operatively coupled to their air cylinders 329a and 329b, respectively, so that the rails 308 and 331 may be reciprocated in the directions indicated by the double pointed arrows D and E.

The distance between these rails or guides 308 and 311 on the one hand and the rail or guide 306 on the other hand may be adjusted as the rails or guides 308 and 311 are moved toward or away from the rail or guide 306 in such manner that the sides of the printed circuit board may ride on the stepped guide passages of the rails or guides 308, 311 and 306 and may smoothly move therealong.

A lead screw 341 is extended between the upright walls of the bracket 303 below and in parallel with the rail 306. This lead screw is operatively coupled to a reversible motor 337 through a pulley drive comprising pulleys 334 and 336 and a belt 335.

A threaded nut 340 with a flange 342 is non-rotatably mounted on the lead screw 341 so that as the latter is rotated, the nut 340 may be translated. A guide roller 344 is rotatably mounted with a shaft 343 on top of the flange 342 of the nut 340 and is fitted into a guide groove 339 formed lengthwise in the undersurface of the rail or stationary guide 306. Upon rotation in the counterclockwise direction indicated by F of the reversible motor 337, the nut 340 is translated in the direction indicated by the arrow F; that is, to the left in FIG. 46. Since a hook 345 extended from the flange of the nut 340 in parallel with the lead screw 341 is brought into engagement with the trailing edge of the printed circuit board riding on the stepped guide passages of the rails or movable guides 308 and 331 and the rail or the stationary guide 306, the printed circuit board is moved in the direction F; that is to the right in FIG. 46. The displacement of the nut 340 may be detected by microswitches 349a and 349b mounted on a bracket which in turn is attached to one side of the bracket 303 and microswitches 354a, b and c which are located on the other side of the bracket 303 and spaced apart by suitable distances from each other.

The free or upper end of the piston rod 351 of an air cylinder 338 is pivoted or otherwise attached to the undersurface of a T-shaped plate 316 so that as the air cylinder 338 is actuated, the T-shaped plate 316 may be vertically reciprocally moved along parallel upright guide posts or rods 327a and 327b between the rails or the movable guides 308 and 331. A slider 317 is mounted on the leg portion of the vertically movable T-shaped plate 316 for slidable movement in the lengthwise or the directions indicated by the arrows A and B. An adjusting plate 320 is mounted on the slider 317 adjacent to the inner end thereof and securely attached thereto with bolts. Many adjusting tapped holes are formed in the upper surface of the adjusting plate 320 for the purpose to be described below. Levers 321a, b and c which suspend at their one ends vacuum suction pads 325a, b and c, respectively, have elongated slots extended lengthwise. The bolt is fitted into this elongated slot of the lever 321 and tightly screwed into one of the adjusting tap holes in the adjusting plate 320 after the position of the vacuum suction cup or pad 325 has been adjusted. Thus, the adjusting tapped holes in the adjusting plate 320 are used for adjusting the positions of the vacuum suction pads 325a, b and c which are brought into engagement with the upper surface of the printed circuit board at such portions where no insertion holes are formed, thereby attracting and holding it. The vacuum suction pads 325a, b and c are communicated through flexible tubes (indicated by broken lines) with a vacuum pump 333.

A frame or plate 315 is securely mounted on the tops of the guide posts 327a and b in parallel with the T-shaped plate 316 which may be movable along them. A cam 314 with a cam surface 352 is extended from the stationary frame or plate 315 in parallel with the leg portion of the T-shaped plate 316. A cam follower or a roller 312 is rotatably mounted with a shaft 313 on the slider 317 which is slidable lengthwise on the leg portion of the T-shaped plate 316 as described above. The slider 317 is biased under the force of an extension spring 319 in the direction indicated by the arrow B. When the T-shaped plate 315 is moved upwards along the guide posts 327a and 327b as the piston rod 351 of the air cylinder 338 is extended, the roller 312 on the slider 317 which in turn is mounted on the T-shaped plate 316 for slidable movement is engaged with the cam surface 352 at the leading or free end of the cam 314 extended from the stationary frame or plate 315 so that the slider 317 is forced to move in the direction indicated by the arrow A against the bias spring 319.

Many printed circuit boards P4, P5, . . . are stacked on a printed circuit board supporting plate or board 360 disposed immediately below the adjusting plate 320. Two L-shaped guide members 350 and 353 are extended upwards from the supporting plate or board 360 in such a manner that they may guide the diagonally opposite corners of the printed circuit boards P4, P5, . . . . In FIG. 46, the supporting plate or board 360 is illustrated as being positioned away from the printing circuit board loading or feeding device for the sake of simplicity, but in operation, the supporting board 360 is placed immediately below the adjusting plate 320 within the loading device as described above.

Next, the mode of operation of the printed circuit board loading or feeding device with the above construction will be described in more detail hereinafter. First, the air cylinders 329a and 329b are actuated so that the rails or the movable guides 308 and 331 are moved in either the direction D or E so that the distance between the rail or the movable guides 308 and 311 on the one hand and the stationary guide 306 on the other hand may be adjusted so as to permit the smooth passage of the printed circuit board therebetween. Next, the air cylinder 338 is so actuated as to retract its piston rod 351. The T-shaped plate 316 with the adjusting plate 320 to which are attached the levers 321a, b and c suspending the vacuum suction pads 325a, b and c is lowered along the guide posts 327a and 327b. At the same time, the vacuum pump 333 is driven. When microswitches 326 suspended from the vacuum suction pad supporting bars 321a, b and c are brought into engagement with the upper surface of the uppermost printed circuit board P4 stacked on the supporting plate or board 360, the downward movement of the T-shaped plate 316 is stopped as the air cylinder 338 is de-energized from the signals from the microswitches 326.

Under these conditions, the vacuum suction pads 325a, b and c are pressed against the upper surface of the uppermost printed circuit board P4 under suitable forces of bias springs 324 and attracts the circuit board P4. Thereafter, the upward movement of the T-shaped plate 316 is started as the air cylinder 338 is actuated again so as to extend its piston rod 351 so that the printed circuit board P4 is lifted by the vacuum suction pads 325a, b and c. As the T-shaped plate 316 is moved upwards, the printed circuit board P4 passes between the stationary guide 306 and the movable guides 308 and 331. As the roller 312 on the slider 317 engages with the cam surface 352 of the cam 314 extended from the stationary plate 315, the slider 317 and hence the printed circuit board P4 are shifted by a predetermined distance in the direction A so that the interference of the suspended printed circuit board P4 with the stationary rail or guide 306 may be avoided. Thereafter, the air cylinders 329a and 329b are actuated again so as to displace the rails or the movable guides 308 and 331, in the direction D by a predetermined stroke and the vacuum pump 333 is de-energized. Then, the printed circuit board P4 is released from the vacuum suction pads 325a, b and c and drops so as to be guided by a guide plate attached to the stationary guide 306 and guide plates attached to the movable guides 308 and 331, respectively. Next, the reversible motor 337 is energized so that the hook 345 extended from the flange 142 of the nut 340 is moved in the direction F. The hook 345 engages with the trailing edge of the printed circuit board P4 and pushes it in the direction F so that the printed circuit board P4 may be transferred onto the conveyor rails Ra and Rb.

We claim:
1. An automatic part insertion machine, for inserting parts having leads extending therefrom in holes of printed circuit boards comprising:
  (a) a pair of parallel conveyor rails so arranged as to support a plurality of printed circuit boards in one row extending in a lengthwise direction,
  (b) a first control means for simultaneously displacing said pair of parallel conveyor rails in a direction transverse to said lengthwise direction,
  (c) a second control means for simultaneously displacing said plurality of printed circuit boards in the lengthwise direction,
  (d) a device for feeding one by one printed circuit boards upon which are to be mounted electric parts onto said pair of parallel conveyor rails from one end thereof,
  (e) a device for stacking one by one the printed circuit boards fed thereto from the other end of said pair of parellel conveyor rails,
  (f) a plurality of part feeding devices arranged in one row in said lengthwise direction along one side of said pair of parallel conveyor rails for feeding different types of parts to respective printed circuit boards on said pair of parallel conveyor belts and inserting the leads of said fed parts into corresponding predetermined insertion holes of said printed circuit boards, and
  (g) a numerical control system for controlling said first and second control means so as to cause said plurality of printed circuit boards to move along said pair of parallel conveyor rails and to stop when one of said plurality of printed circuit boards is adjacent a specified part feeding device, thereby positioning said one printed circuit board with respect to said specified part feeding device and to actuate said specified part feeding device to cause the leads of a corresponding part to be inserted into predetermined holes of said one printed circuit board.

2. An automatic part insertion machine as set forth in claim 1 further characterized in that said second control means comprises
(a) a means disposed between said pair of parallel conveyor rails and operatively coupled to a servo-motor so as to displace said plurality of printed circuit boards in the lengthwise direction thereof,
(b) a first shaft rotatably so operatively coupled to said displacing means as to rotate freely about its axis,
(c) a second shaft mounted on said first shaft in parallel therewith and spaced apart therefrom by a suitable distance,
(d) a plurality of hooks attached on said second shaft and spaced apart from each other by a suitable distance for selectively engaging with reference holes of said plurality of printed circuit boards lengthwise movably supported on said pair of parallel conveyor rails, and
(e) means for rotating through a predetermined angle said first and second shaft about the axis of said first shaft, thereby causing said plurality of hooks to engage with or disengage from said reference holes of said plurality of printed circuit boards.

3. An automatic part insertion machine as set forth in claim 1 further characterized by the provision of
(a) a bar disposed for slidable movement along said pair of parallel conveyor rails while being subjected to suitable frictional forces, thereby feeding an unfinished printed circuit board which is loaded or fed onto said pair of parallel conveyor rails at said one ends thereof by said printed circuit board loading or feeding device, to a first insertion position while unloading the finished printed circuit board into said finished printed circuit board stacking or stocking device at said other ends of said pair of parallel conveyor rails,
(b) a pair of intermeshing sector gears rotatably attached to said bar at the positions adjacent to the midpoint between its ends,
(c) two hook means pivoted to said bar at its ends respectively, each hook means operatively connected with a pair of spaced parallel wires to said pair of intermeshing sector gears, respectively, so that when one of said pair of intermeshing sector gears is rotated in one direction while the other sector gear is rotated in the other direction to cause said two hooks operatively connected to said two sector gears to swing about their pivot points in said one direction and in said other direction, respectively, for engagement with (i) the last printed circuit board in said row of said plurality of printed circuit boards which is most closely located to said one end of said pair of parallel conveyor rails and (ii) the first printed circuit board in said row most closely located to said other end of said pair of parallel conveyor rails; and when said one sector gear is rotated in the other direction while said other sector gear is rotated in said one direction, said two hooks are rotated in the same direction, respectively, thereby disengaging from said printed circuit boards with which they have been engaged, and
(d) a pulley drive system for causing said one sector gear to rotate in said one direction or in said other direction and to translate said bar,
said pulley drive system comprising
a reversible motor,
a driving pulley drivingly coupled to said reversible motor,
a driven pulley spaced apart from said driving gear by a suitable distance,
a belt which is extended between and partly wrapped around said driving and driven pulleys and which has its both ends securely attached to an arm extended from said one sector gear radially outwardly thereof, and
a means for imparting a suitable tension to said belt.

4. An automatic part insertion machine as set forth in claim 1 further characterized in that each of said plurality of part feeding devices includes
(a) a slider means with a center through hole,
(b) a guide means disposed for guiding the vertical reciprocal movement of said slider means,
(c) a shaft which is fitted through said center through hole of said slider means for free rotation therein and which carries at one end a mounting disk upon which may be removably mounted a part insertion chuck and at the other end a crank means which carries a roller,
(d) a cam plate with upper and lower straight cam surfaces in coplanar relationship and spaced apart from each other by a recess extended transversely of said upper and lower straight cam surfaces, and
(e) a bias spring means disposed in said slider means for giving the torques to said roller of said crank means in such a way that said roller may be pressed against said upper or lower straight cam surface, whereby after said roller leaves said upper or lower straight cam surface, pushed into said recess and comes out of it to ride again said lower or upper straight cam surface, said roller may be caused to rotate through 180° and consequently said crank means, said mounting disk and said part insertion chuck mounted on said mounting disk may be rotated through 180° everytime when said slider means makes a downward or upward movement along said guide means.

5. An automatic part insertion machine as set forth in claim 1 further characterized in that one of said plurality of part feeding devices has a part insertion chuck including
(a) an outside former having a pair of spaced parallel legs,
(b) a pusher which is disposed for slidable movement between said pair of spaced parallel legs of said outside former and which has a pair of spaced parallel legs extended from the free end of said pusher so as to make a slidable movement along the opposing inner surfaces of the pair of spaced parallel legs of said outside former, said pair of spaced parallel legs of said pusher being shorter than those of said outside former, the root of each of said pair of spaced parallel legs of said pusher being stepped horizontally inwardly or transversely inwardly by a suitable distance,
(c) a stationary former or die which is held stationary and which has a pair of parallel legs downwardly protruded and extended from the lower ends of said stationary former or die by a suitable distance and spaced apart from each other by a distance shorter than the distance between the opposing inner surfaces of said pair of spaced parallel legs of said pusher, the distance between the outer surfaces of said pair of parallel legs of said stationary former or die being shorter than the width thereof, whereby when an axial type part is placed between said stationary former or die on the one hand and said outside former and said pusher on the other hand and when said outside former and said pusher are advanced toward said stationary former or die, the leads of said axial type part are formed between them in such a way that each of said leads of said axial type part is extended horizontally from the main body of said axial type part by a predetermined distance between said stepped portions at the roots of said pair of spaced parallel legs of said pusher on the one hand and the leading or lower ends of said pair of parallel legs of said stationary former or die on the other hand, bent upwardly at right angles to said horizontally extended portions of said leads between the outside surfaces of said pair of parallel legs of said stationary former or die on the one hand and the inner surfaces of said pair of spaced parallel legs of said pusher, bent further transversely outwardly between the stepped portions at the roots of said pair of parallel legs of said stationary former or die on the one hand and the leading ends of said pair of spaced parallel legs of said pusher and bent again upwardly at right angles to said second stepped portions of said leads between the inner surfaces of said pair of spaced parallel legs of said outside former and said main body of said stationary former or die, and when the leads thus formed of said axial type part are inserted into specified insertion holes of a printed circuit board, said second stepped portions of said leads engage with the upper surface of said printed circuit board while the straight portions extended therefrom being inserted into said specified insertion holes so that the main body of said axial type part may be spaced apart from the upper surface of said printed circuit board by a distance substantially equal to the length of the straight portions of said leads of said axial type part.

6. An automatic part insertion machine as set forth in claim 5 further characterized by the provision of an envil which may be disposed immediately below said printed circuit board in such a manner that the recesses formed in the upper surface of said anvil may be aligned with said specified insertion holes, respectively, of said printed circuit board, and said outside former and said pusher are so constructed and arranged that when the leading ends of said pair of spaced parallel legs of said outside former are lowered and brought into engagement with the upper surface of said printed circuit board in the lead insertion operation, the further downward movement of said outside former is prevented but the downward movement of said pusher is permitted, whereby said second straight portions of said leads of said axial type part may be inserted through said specified insertion holes of said printed circuit board and into said recesses of said anvil and are guided by said recess of said anvil so as to be clinched against the undersurface of said printed circuit board.

7. An automatic part insertion machine as set forth in claim 1 further characterized in that one of said part feeding devices includes
a disk-shaped or drum-shaped holder,
a plurality of elongated magazines equiangularly and uprightly and removably mounted on said holder along the periphery thereof,
each of said elongated magazines being divided into a plurality of part loading chambers with one or more lengthwise extended partition walls,
a plurality of parts being stacked in each of said part loading chambers of said magazines,
a disk which is disposed below said holder and is formed with recesses each of which is arranged so as to be in line with one of said plurality of loading chambers of each of said plurality of magazines, one part being received in each of said recesses, whereby when said holder and said disk are rotated in unison, the parts are picked up one at a time sequentially from said recesses and when one of said loading chambers of each of said magazines is emptied, said holder is caused to rotate relative to said disk through such an angle that the next loading chamber of said magazine may be brought to be in line with said recess.

8. An automatic part insertion machine as set forth in claim 1 further characterized in that
one of said plurality of part feeding devices includes a stationary disk having an annular guide formed around the periphery thereof and raised and a part feeding portion which is a portion of said annular guide and is lowered,
a drum disposed coaxially of said stationary disk for rotation about the axis thereof,
a plurality of magazines in each of which a plurality of parts are stacked and which are mounted on said drum in equiangular and opposed relationship,
a plurality of holder pins each of which is provided with a flange, rigidly attached to said drum and is so obtained under the force of a bias spring so as to extend its end remote from said flange between each of said magazines and said guide, thereby preventing the falling of an IC chip or element, and levers which sequentially engage with the flanges of said holder pins before said feeding position as said drum is rotated, thereby pulling the flange outwardly together with said holder pin so as to permit the IC chip or element in said magazine to drop on said guide, said levers being disposed adjacent to said drum.

9. An automatic part insertion machine as set forth in claim 8 further characterized in that
after the IC chip or element has been dropped onto said guide, a supporting member is advanced toward said IC element which is held upright at said feeding position so as to prevent the falling of said IC chip or element, said upright IC chip or element is clamped by a U-shaped clamping means,
said supporting member is moved away from said feeding position while said clamping means is rotated so that said IC chip or element may be held horizontally.
thereafter said supporting member is moved toward said feeding position in such a manner that the base of said supporting member may be overlaid on said IC chip or element,
a part insertion chuck pulls said horizontally held IC chip or element out of said clamping means, and said clamping means from which said IC chip or element has been released is rotated so as to be returned to said feeding position.

10. An automatic part insertion machine as set forth in claim 7 further characterized by the provision of
a part clamping means having a first gear, a means for pushing horizontally a part in a recess so as to have said part clamped by said part clamping means, a means for causing said part clamping means, which is clamping said part, to rotate through 90° so that said part may be directed downwards, and a second gear which is provided with a brake mechanism and brought into mesh with said first gear, whereby when said second gear is permitted to rotate freely as said brake mechanism is not actuated, said part clamping means may be rotated to the vertically downwards without causing the rotation of said part clamping means about its axis, but when said brake mechanism is actuated so that the rotation of said second gear is prevented, said first gear is caused to rotate by said second gear so that said part clamping means is rotated vertically downwardly while said part clamping means is caused to rotate about its axis, thereby feeding said part to said part insertion chuck.

* * * * *

UNITED STATES PATENT AND TRADEMARK OFFICE
CERTIFICATE OF CORRECTION

PATENT NO. : 4,202,092

DATED : May 13, 1980

INVENTOR(S) : Hatsuhiko Shibasaki, et al

It is certified that error appears in the above—identified patent and that said Letters Patent is hereby corrected as shown below:

The attached four (4) sheets of drawings containing Figs. 39 through 46 are inserted.

Figure 46:
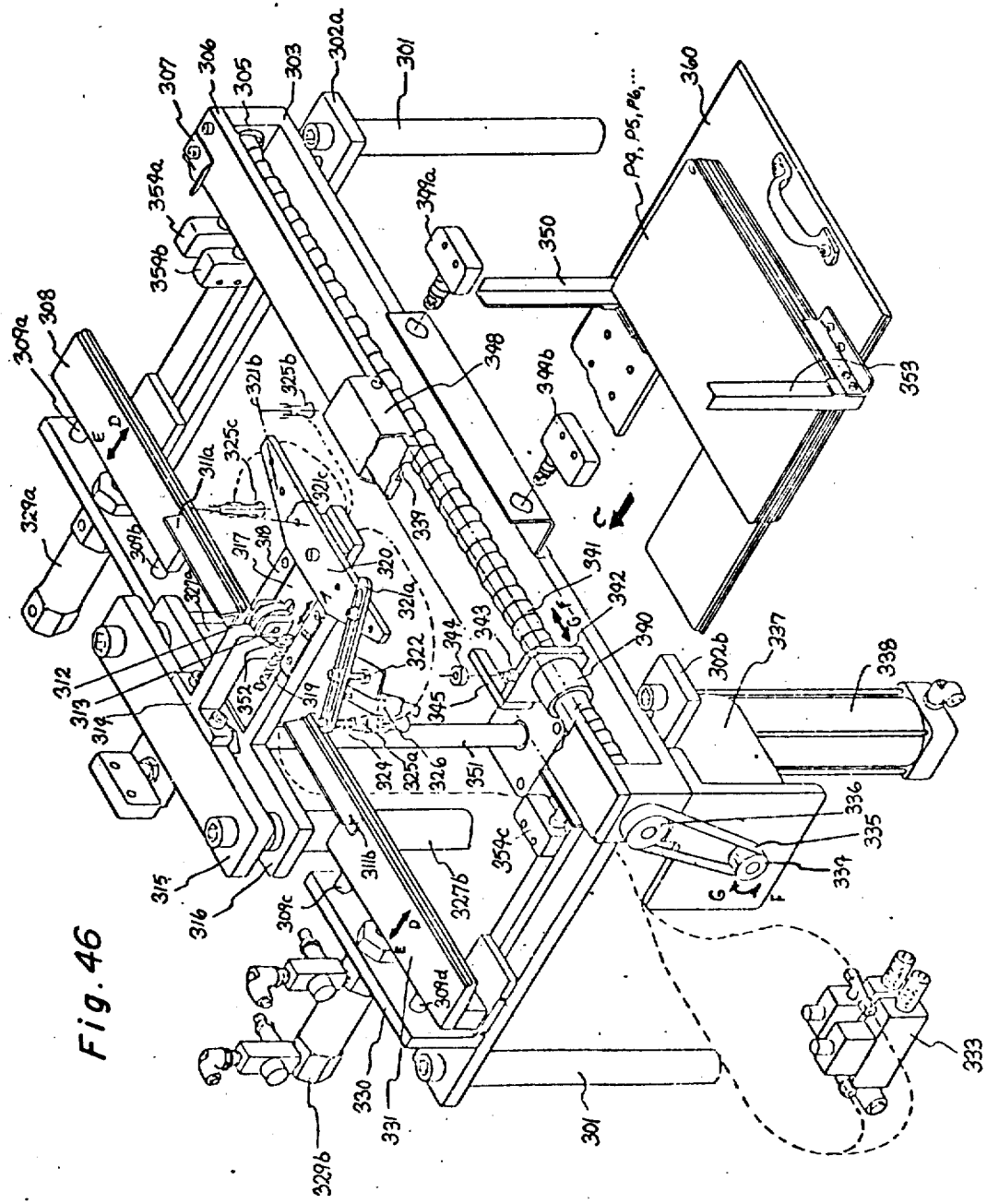

Column 4, between lines 37 and 38, the following is inserted:

--Figs. 39, 40 and 41 are views used for the explanation of the construction as well as the mode of operation of a mechanism for transferring the IC chip or element delivered from said feed or index position to the position immediately above an IC chip or element insertion chuck where the IC chip or element is transferred to the chuck;

Figs. 42, 43, 44 and 45 are views used for the explanation of the steps of the IC chip or element chuck for gripping the IC element; and Fig. 46 is a perspective view of a printed circuit board loading or unloading device for feeding, one at a time, printed circuit boards onto the conveyor rails shown in Fig. 1.--

Signed and Sealed this

Twenth-eighth Day of September 198.

[SEAL]

Attest:

GERALD J. MOSSINGHOFF

Attesting Officer

Commissioner of Patents and Trademarks